(12) United States Patent
Koo et al.

(10) Patent No.: US 11,923,817 B2
(45) Date of Patent: Mar. 5, 2024

(54) PACKAGING SURFACE ACOUSTIC WAVE DEVICES WITH CONDUCTIVE TERMINALS

(71) Applicant: Skyworks Solutions, Inc., Irvine, CA (US)

(72) Inventors: Li Ann Koo, Singapore (SG); Takashi Inoue, Singapore (SG); Vivian Sing Zhi Lee, Singapore (SG); Ping Yi Tan, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 71 days.

(21) Appl. No.: 17/364,242

(22) Filed: Jun. 30, 2021

(65) Prior Publication Data
US 2022/0006439 A1 Jan. 6, 2022

Related U.S. Application Data

(63) Continuation of application No. 16/555,985, filed on Aug. 29, 2019, now Pat. No. 11,159,137.
(Continued)

(51) Int. Cl.
*H03H 3/08* (2006.01)
*B23K 26/362* (2014.01)
(Continued)

(52) U.S. Cl.
CPC .............. *H03H 3/08* (2013.01); *B23K 26/362* (2013.01); *H03H 9/02559* (2013.01);
(Continued)

(58) Field of Classification Search
CPC .. H03H 3/08; H03H 9/02559; H03H 9/02622; H03H 9/059; H03H 9/1064;
(Continued)

(56) References Cited

U.S. PATENT DOCUMENTS

| 6,262,513 B1 | 7/2001 | Furukawa et al. |
| 7,148,769 B2 | 12/2006 | Takano |

(Continued)

FOREIGN PATENT DOCUMENTS

| CN | 1134627 | 10/1996 |
| EP | 2256924 | 12/2010 |

(Continued)

OTHER PUBLICATIONS

Token Electronics Industry Co., Ltd., Required to effectively design a Saw Component, Jan. 13, 2017.
(Continued)

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

Methods of making packaged surface acoustic wave devices are provided. The method may include forming a photosensitive resin coat over a cavity-defining structure encapsulating a surface acoustic wave device. The photosensitive resin coat may be formed using a spin-coating process, and then patterned to form a desired shape. Portions of the photosensitive resin may be removed from areas near the edge of the die, to facilitate separation of a wafer into individual dies. The method may also include forming a conductive structure using a plating process, where the conductive structure is located between the resin coat and the cavity defining structure. The photosensitive resin can include a phenol resin. The packaged surface acoustic wave devices made using a photosensitive resin coat may be relatively thin, and may have a height of less than 220 micrometers.

20 Claims, 22 Drawing Sheets

Related U.S. Application Data

(60) Provisional application No. 62/725,133, filed on Aug. 30, 2018.

(51) Int. Cl.
| | | |
|---|---|---|
| *H03H 9/02* | (2006.01) | |
| *H03H 9/05* | (2006.01) | |
| *H03H 9/10* | (2006.01) | |
| *H03H 9/25* | (2006.01) | |

(52) U.S. Cl.
CPC ........ *H03H 9/02622* (2013.01); *H03H 9/059* (2013.01); *H03H 9/1064* (2013.01); *H03H 9/1092* (2013.01); *H03H 9/25* (2013.01); *G01N 2291/0423* (2013.01); *H01L 2224/16* (2013.01)

(58) Field of Classification Search
CPC ...... H03H 9/1092; H03H 9/25; H03H 9/1071; B23K 26/362; B23K 2101/36; B23K 2103/08; B23K 26/355; B23K 26/0006; G01N 2291/0423; H01L 2224/16
USPC .......................... 333/133, 186, 187, 193–196
See application file for complete search history.

(56) References Cited

U.S. PATENT DOCUMENTS

| | | | |
|---|---|---|---|
| 7,479,852 | B2 | 1/2009 | Takamine |
| 7,629,729 | B2 | 12/2009 | Inoue et al. |
| 9,484,886 | B2 | 11/2016 | Takemura |
| 11,159,137 | B2 * | 10/2021 | Koo ...................... H03H 9/1092 |
| 2004/0041496 | A1 | 3/2004 | Imai et al. |
| 2005/0062167 | A1 | 3/2005 | Huang et al. |
| 2005/0151909 | A1 | 7/2005 | Yagi et al. |
| 2007/0075606 | A1 | 4/2007 | Inoue et al. |
| 2007/0252481 | A1 * | 11/2007 | Iwamoto ............... H03H 9/1092 310/344 |
| 2008/0139075 | A1 | 6/2008 | Birrell et al. |
| 2009/0001849 | A1 | 1/2009 | Tsuda |
| 2010/0045145 | A1 | 2/2010 | Tsuda |
| 2010/0236322 | A1 | 9/2010 | Kogai et al. |
| 2010/0283144 | A1 | 11/2010 | Liang |
| 2010/0301708 | A1 | 12/2010 | Tsuda |
| 2011/0221546 | A1 | 9/2011 | Yamaji et al. |
| 2012/0280768 | A1 | 11/2012 | Nakayama et al. |
| 2016/0036416 | A1 | 2/2016 | Nakayama et al. |
| 2017/0033768 | A1 | 2/2017 | Aigner et al. |
| 2017/0117874 | A1 | 4/2017 | Ishibashi et al. |
| 2017/0264266 | A1 | 9/2017 | Kishimoto |
| 2017/0288627 | A1 | 10/2017 | Takano et al. |
| 2018/0076786 | A1 | 3/2018 | Funahashi |
| 2018/0102759 | A1 | 4/2018 | Nishi et al. |
| 2019/0288667 | A1 * | 9/2019 | Hayashi ............. H03H 9/02897 |
| 2020/0076398 | A1 | 3/2020 | Koo et al. |
| 2020/0076399 | A1 | 3/2020 | Koo et al. |
| 2020/0076400 | A1 | 3/2020 | Koo et al. |
| 2020/0076402 | A1 | 3/2020 | Koo et al. |
| 2020/0228090 | A1 * | 7/2020 | Takeshita ............. H03H 9/1085 |

FOREIGN PATENT DOCUMENTS

| | | |
|---|---|---|
| JP | 2004-274574 | 9/2004 |
| JP | 2006-108993 | 4/2006 |
| JP | 2006-352430 | 12/2006 |
| JP | 2011-049991 | 3/2011 |
| JP | 2011-188255 | 9/2011 |
| WO | WO 2008/105199 | 6/2010 |

OTHER PUBLICATIONS

International Search Report issued in International Application No. PCT/US2019/048904 dated Jan. 9, 2020.
Written Opinion issued in International Application No. PCT/US2019/048904 dated Jan. 9, 2020.

* cited by examiner

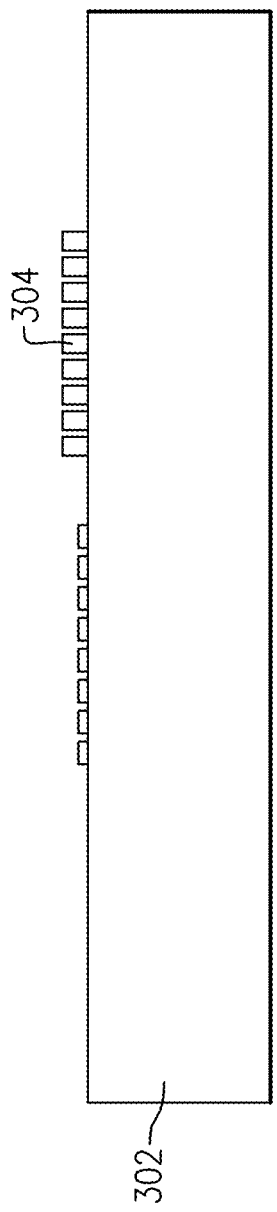
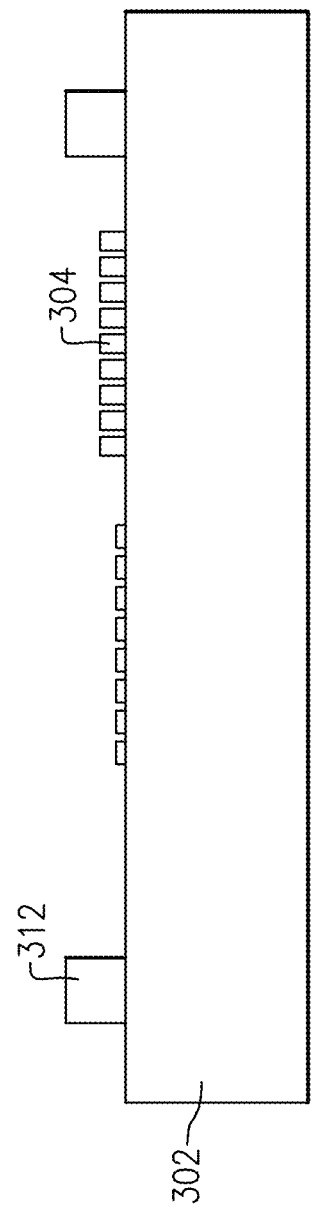

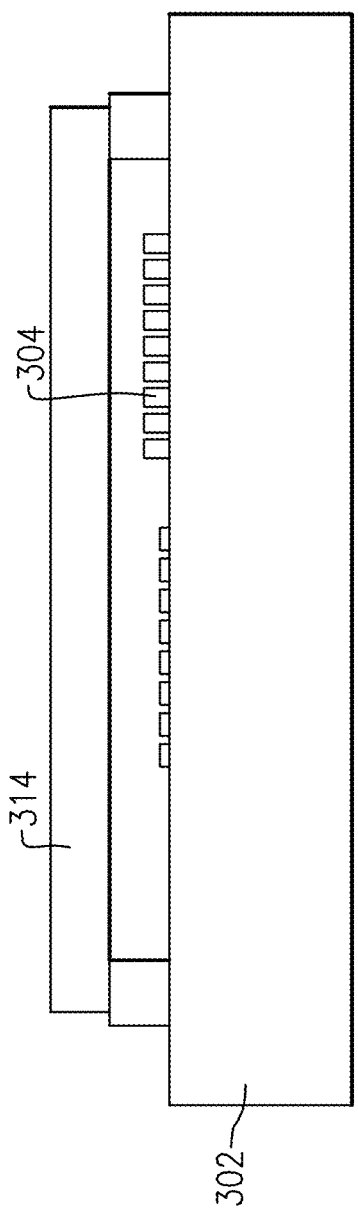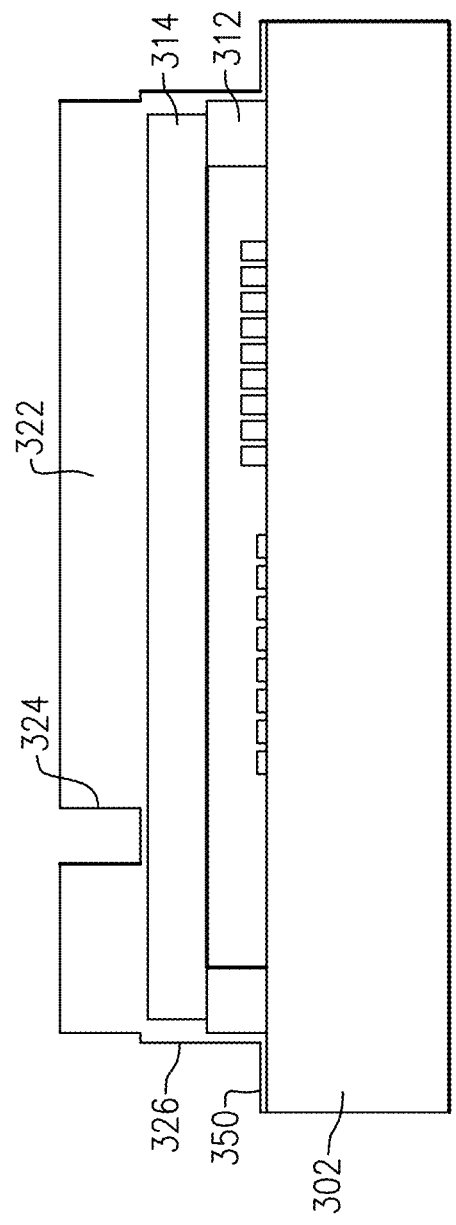

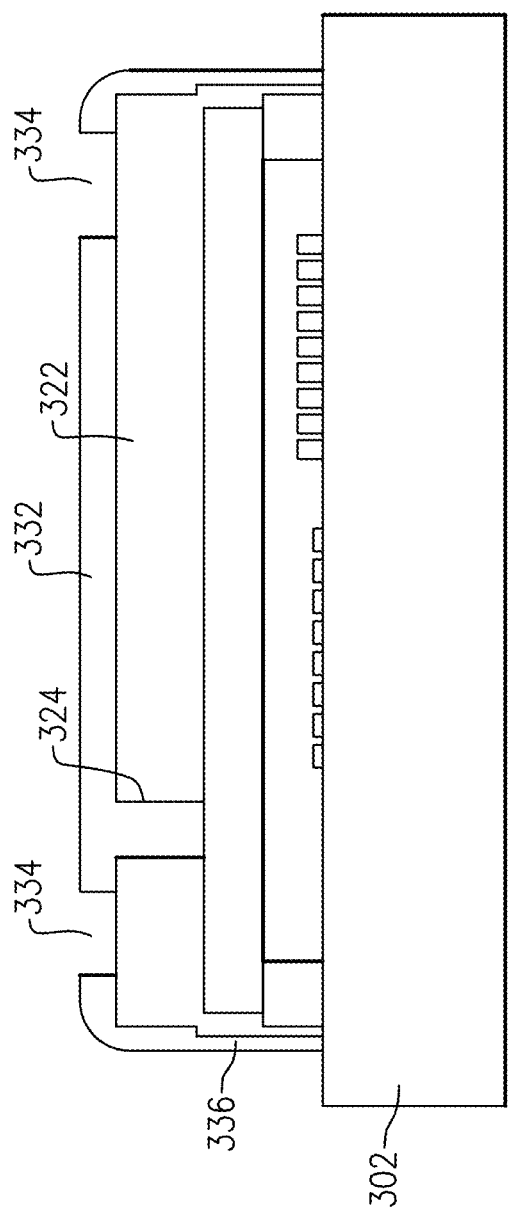
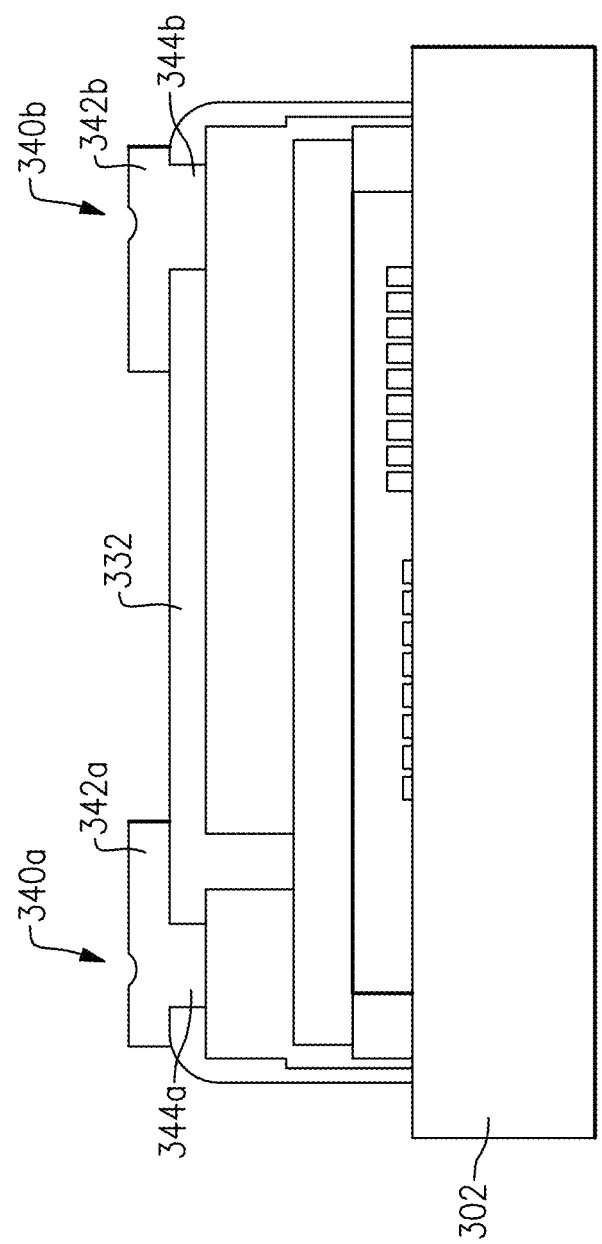

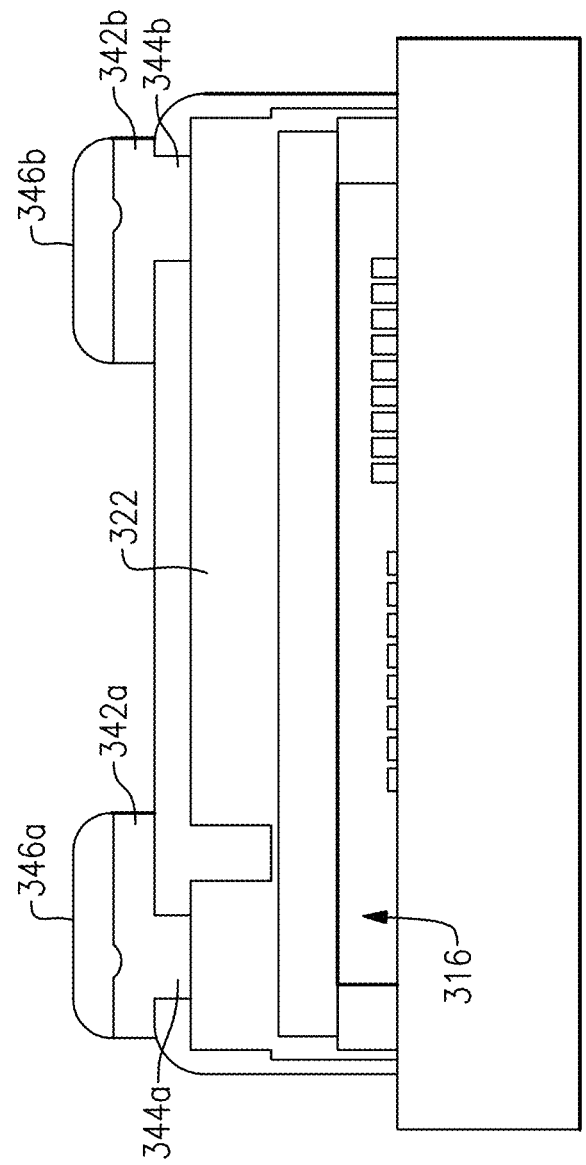

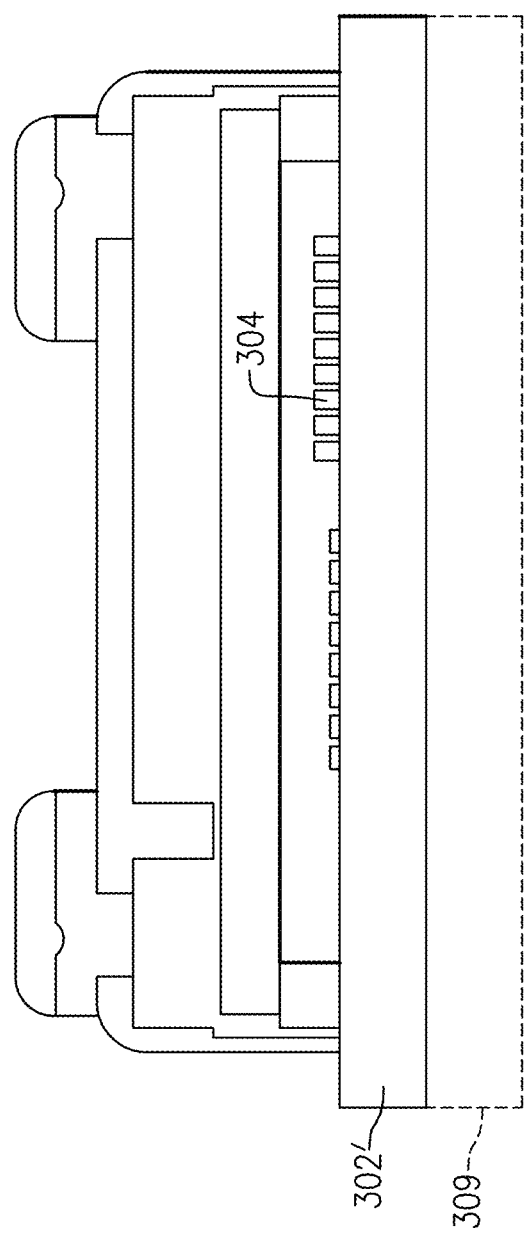

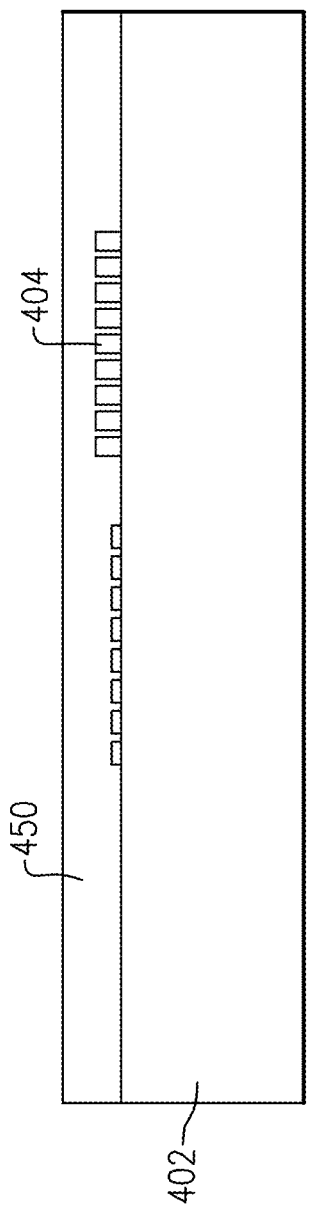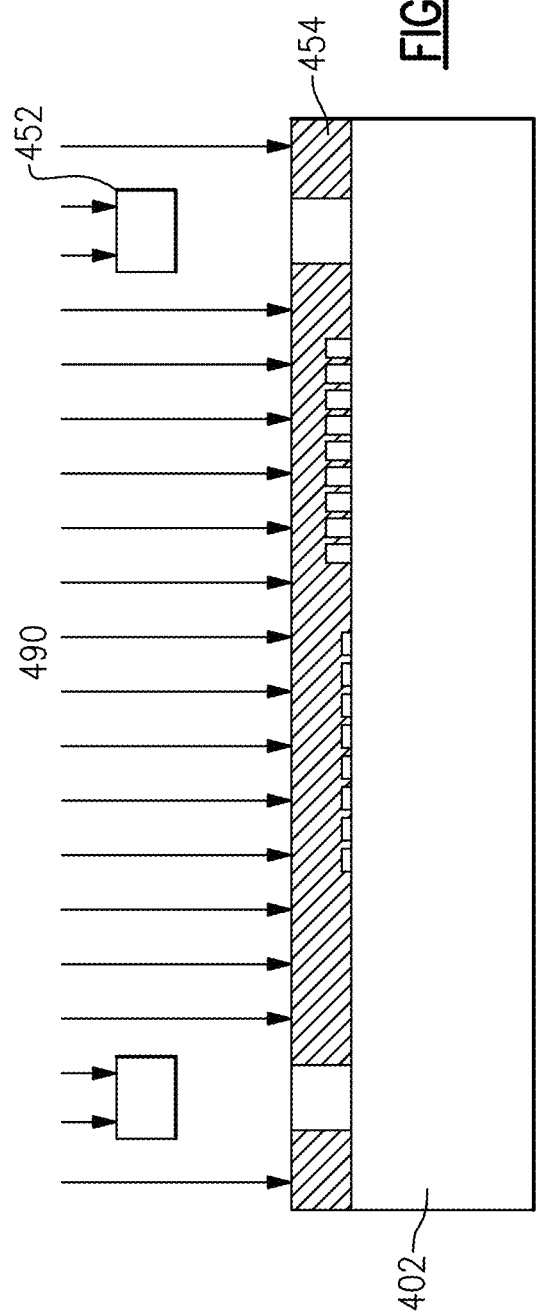

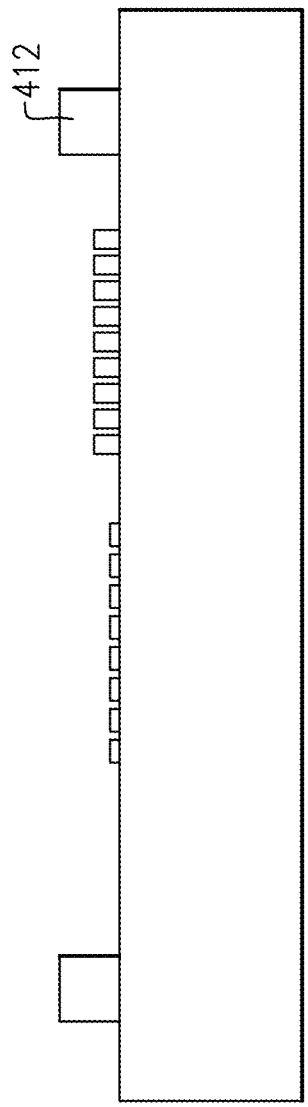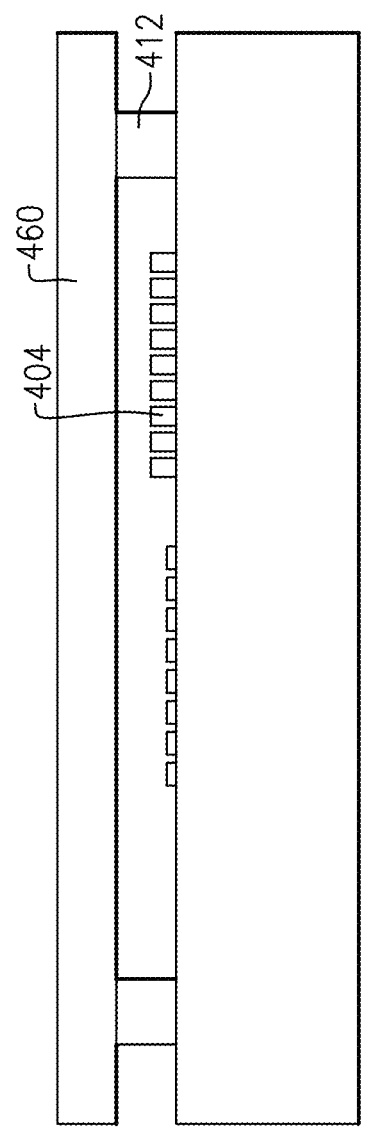

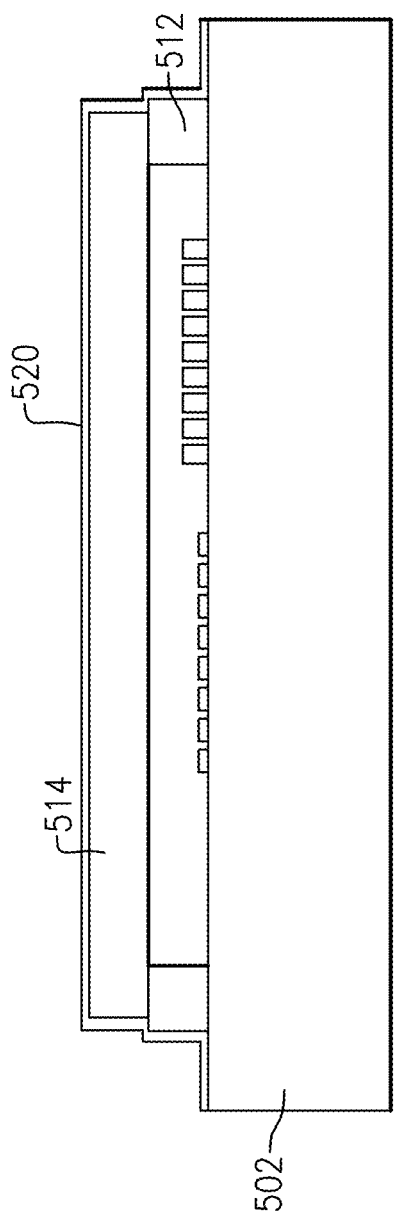
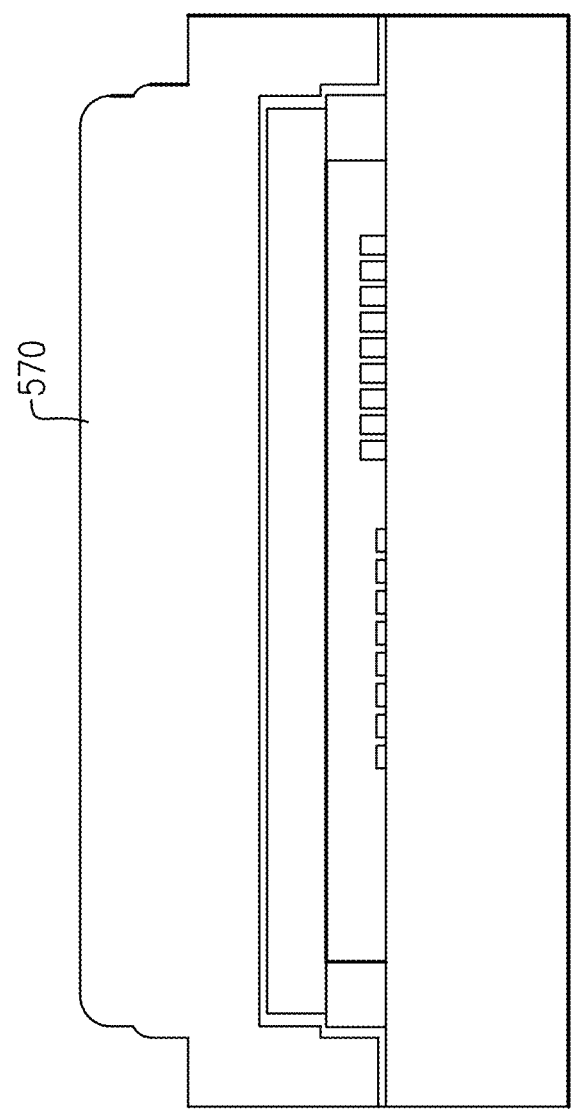

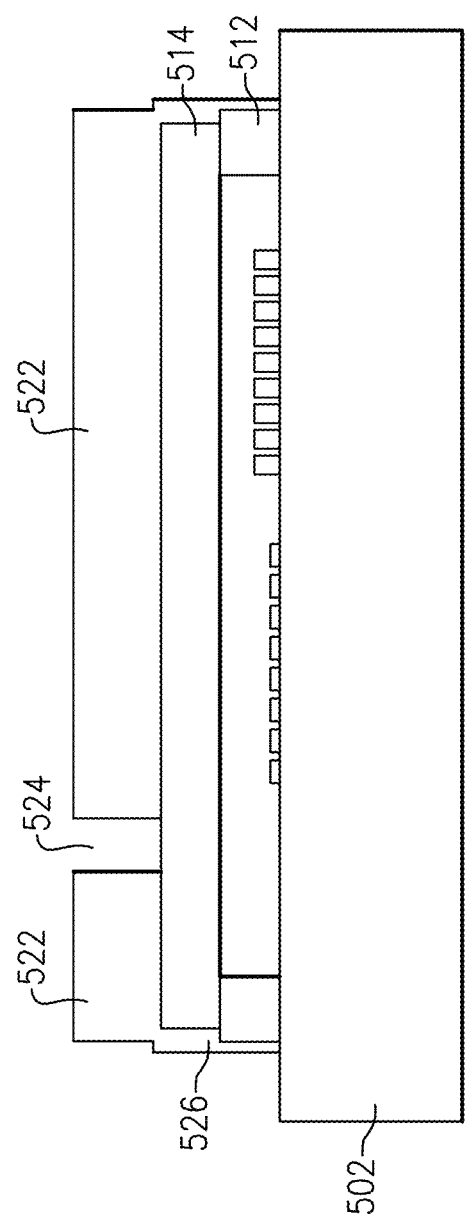

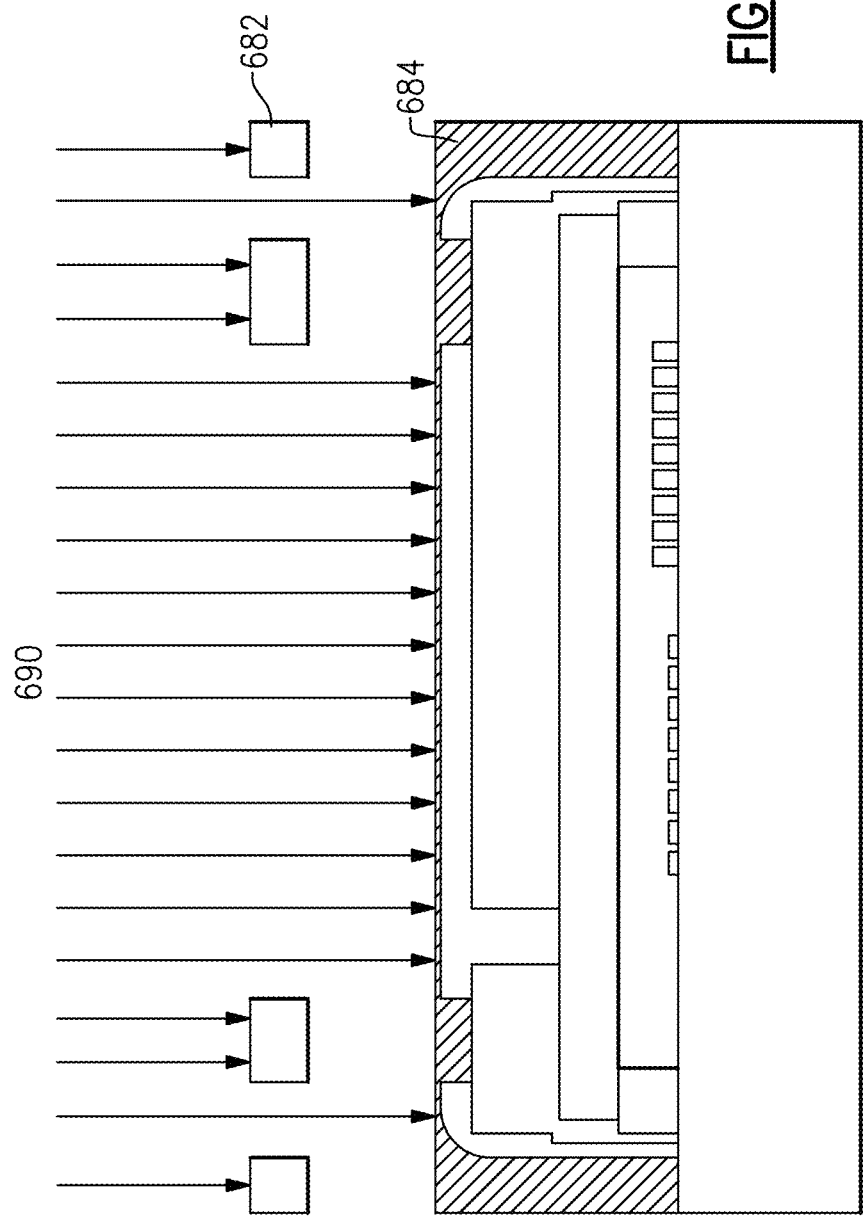

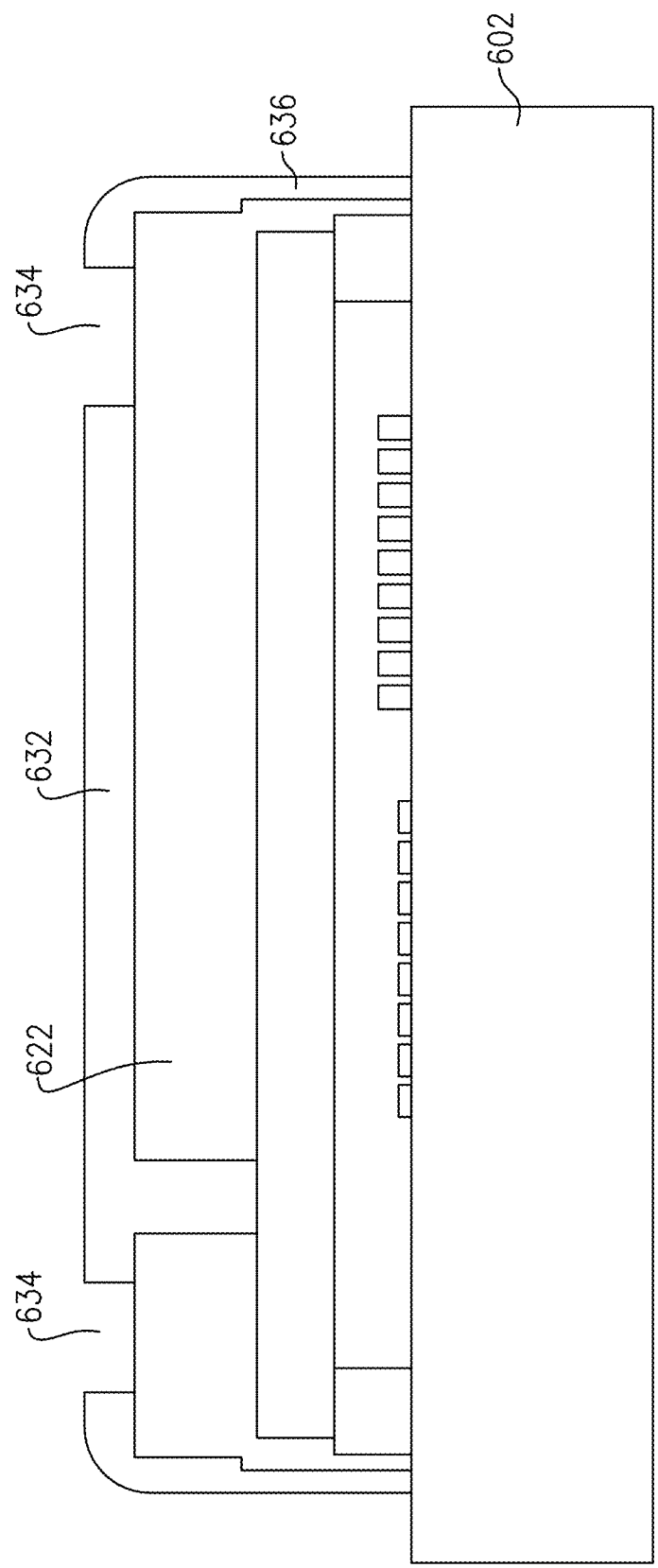

PACKAGING SURFACE ACOUSTIC WAVE DEVICES WITH CONDUCTIVE TERMINALS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application is a continuation of U.S. patent application Ser. No. 16/555,985, filed Aug. 29, 2019 and entitled "METHODS FOR PACKAGING SURFACE ACOUSTIC WAVE DEVICES," which claims the benefit of priority under 35 U.S.C. § 119(e) of U.S. Provisional Application No. 62/725,133, filed Aug. 30, 2018 and entitled "PACKAGED SURFACE ACOUSTIC WAVE DEVICES," the disclosure of which is hereby incorporated by reference in its entirety.

BACKGROUND

Technical Field

Embodiments of this disclosure relate to packaged surface acoustic wave devices.

Description of Related Technology

A surface acoustic wave filter can include a plurality of surface acoustic wave resonators arranged to filter a radio frequency signal. Each resonator can include a surface acoustic wave device. Surface acoustic wave filters can be implemented in radio frequency electronic systems. For instance, filters in a radio frequency front end of a mobile phone can include surface acoustic wave filters. A plurality of acoustic wave filters can be arranged as a multiplexer. For example, two surface acoustic wave filters can be arranged as a duplexer.

Surface acoustic wave devices can be enclosed within a package to protect the surface acoustic wave devices. The package can add to the size of a packaged surface acoustic wave device. There is a desire for smaller and thinner packaged surface acoustic wave devices.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a packaged surface acoustic wave device. The packaged surface acoustic wave device includes a cavity roof over an interdigital transducer electrode of a surface acoustic wave device, a conductive structure over the cavity roof, and a photosensitive buffer coat layer over the conductive structure, the packaged surface acoustic wave device having a height of 220 micrometers or less.

The packaged surface acoustic wave device can have a height of 200 micrometers or less. The photosensitive buffer coat layer can have a height of 15 micrometers or less.

The packaged surface acoustic wave device can further include a piezoelectric substrate having a first side on which the interdigital transducer electrode is disposed, and a cavity wall on the first side of the piezoelectric substrate and supporting the cavity roof. An edge portion of the first side of the piezoelectric substrate can be free from the photosensitive buffer coat layer.

The packaged surface acoustic wave device can further include a piezoelectric substrate having a first side and a second side opposite the first side, the interdigital transducer electrode being on the first side, and a marking extending into the second side, the marking extending 1 micrometer or less into the piezoelectric substrate. The packaged surface acoustic wave device of claim 1 can further include a terminal in physical contact with the conductive structure though an opening in the photosensitive buffer coat layer.

The photosensitive buffer coat layer can include phenol resin. The photosensitive buffer coat layer can have a negative photosensitivity.

The surface acoustic wave device can include a plurality of surface acoustic wave resonators configured to filter a radio frequency signal.

Another aspect of this disclosure is a packaged surface acoustic wave device that includes a cavity structure supported by a die and cooperating the die to encapsulate an interdigital transducer electrode of a surface acoustic wave device, a conductive structure extending over a portion of an outer surface of the cavity structure, and a insulating layer extending over the conductive structure, a portion of the insulating layer overlying a portion of the conductive structure having a thickness of less than 15 micrometers.

The cavity structure can include a cavity wall supported by a first surface of the die and a cavity roof extending over the interdigital transducer electrode and supported by the cavity wall. The packaged surface acoustic wave device can further include a plurality of terminals, each of the terminals extending through a portion of the insulating layer and contacting a portion of the conductive structure.

The insulating layer can include a photoresist material. The insulating layer can include a negative photoresist.

The die can include a laser-marked piezoelectric substrate having a first side and a second side, the first side supporting the cavity structure, the second side of the laser-marked piezoelectric substrate having a laser-marked section.

Another aspect of this disclosure is a packaged surface acoustic wave device that includes a piezoelectric substrate, a packaging structure supported by a first surface of the piezoelectric substrate and defining a cavity, the packaging structure including an outer layer including photosensitive resin, and a plurality of interdigital transducer electrodes supported by the piezoelectric substrate and located within the cavity.

The packaging structure can include a cavity roof and a cavity wall, the cavity roof and the cavity wall both located between a portion of the outer layer and the plurality of interdigital transducer electrodes.

The packaging structure can include a conductive structure in electrical communication with at least one of the plurality of interdigital transducer electrodes. The packaging structure can include at least one terminal overlying a portion of the outer layer and extending through a portion of the outer layer to contact the conductive structure.

Another aspect of this disclosure is a method of manufacturing a packaged surface acoustic wave device, the method including forming a photosensitive resin over a conductive structure, a portion of the conductive structure located over a cavity roof over an interdigital transducer electrode of the surface acoustic wave device, and forming a conductive terminal in contact with the conductive structure, at least a portion of the conductive terminal extending through an aperture extending through the photosensitive resin.

The method can additionally include exposing portions of the photosensitive resin to light to develop portions of the photosensitive resin and removing unexposed portions of the photosensitive resin. The method can additionally include curing the photosensitive resin after removing unexposed portions of the photosensitive resin. Exposing portions of the photosensitive resin to light can include masking a portion of the photosensitive resin extending over a portion of the conductive structure to form the aperture extending through the photosensitive resin.

Forming the terminal can additionally include forming a conductive layer extending over the aperture extending through the photosensitive resin. The aperture can extend through a portion of the photosensitive resin having a thickness of 15 micrometers or less.

The photosensitive resin can include phenol resin. The photosensitive resin can have a negative photosensitivity.

The can additionally include laser marking a piezoelectric substrate on which the interdigital transducer electrode is disposed.

The packaged surface acoustic wave device can have a height of less than 220 micrometers.

Another aspect of this disclosure is a method of manufacturing a packaged surface acoustic wave device, the method including forming a cavity structure encapsulating interdigital transducer electrodes of a surface acoustic wave device, the interdigital transducer electrodes supported by a piezoelectric substrate, forming a conductive structure extending over portions of an outer surface of the cavity structure, and forming a photoresist layer over the conductive structure, a portion of the photoresist layer extending over a portion of the conductive structure having a thickness of less than 15 micrometers.

The method can additionally include patterning the photoresist layer to form a photoresist buffer coat extending over the conductive structure and the cavity structure and curing the photoresist layer. The photoresist buffer coat can include a sidewall portion in contact with the piezoelectric substrate and circumscribing the cavity structure. A portion of the conductive structure can be in contact with the piezoelectric substrate.

Forming the photoresist layer over the conductive structure can include using a spin-on process to planarize the photoresist layer. The method can additionally include removing portions of the photoresist layer within 10 micrometers of the edge of the die.

Another aspect of this disclosure is a method of manufacturing a packaged surface acoustic wave device, the method including forming a cavity structure extending over interdigital transducer electrodes of the surface acoustic wave device, and forming a conductive structure extending over portions of an outer surface of the cavity structure, and forming a photosensitive resin layer over the conductive structure, a portion of the photosensitive resin layer having an aperture extending therethrough and exposing a portion of the conductive structure.

Forming the conductive structure can include depositing a seed layer over the cavity structure and plating the conductive structure onto the seed layer. Forming the conductive structure further can include masking portions of the seed layer prior to plating the conductive structure onto the seed layer.

The conductive structure can include a gap extending through a portion thereof and exposing a portion of the cavity structure, and the photosensitive resin layer can fill the gap. The method can additionally include forming a conductive terminal extending through an aperture in the photosensitive resin layer and in electrical communication with the conductive structure.

Another aspect of this disclosure is a packaged surface acoustic wave device that includes a piezoelectric substrate having a first side and a second side, an interdigital transducer electrode encapsulated within a package structure and supported by the first side of the piezoelectric substrate, and a marking formed in the second side of the piezoelectric substrate.

The marking can extend less than 1 micrometer into the second side of the piezoelectric substrate. The marking can extend into less than 1% of a thickness of the piezoelectric substrate. The marking can be formed by a laser.

The piezoelectric substrate can include lithium niobate. The piezoelectric substrate can include lithium tantalite.

The package structure can include a cavity structure encapsulating the interdigital transducer electrode and an outer coat including a photosensitive resin. A total thickness of the packaged surface acoustic wave device can be less than 220 micrometers.

The package structure can include a photosensitive resin buffer coat. The photosensitive resin buffer coat can include phenol resin. The photosensitive resin buffer coat can include a negative photoresist. The packaged surface acoustic wave device can additionally include a plurality of terminals extending through apertures in the photosensitive resin buffer coat.

Another aspect of this disclosure is a packaged surface acoustic wave device that includes a laser-marked piezoelectric substrate having a first side and a second side, the second side of the laser-marked piezoelectric substrate having a laser-marked section, an interdigital transducer electrode supported by the first side of the laser marked piezoelectric substrate, and a structure supported by the first side of the laser-marked piezoelectric substrate defining a cavity enclosing the interdigital transducer electrode.

The laser-marked section can have been exposed to a deep ultraviolet laser. The laser-marked section can include laser markings extending less than 1 micrometer into the second side of the piezoelectric substrate.

The laser-marked piezoelectric substrate can include lithium niobate. The laser-marked piezoelectric substrate can include lithium tantalite.

The package structure can include a photosensitive resin buffer coat. The photosensitive resin buffer coat can include phenol resin. The photosensitive resin buffer coat can include a negative photoresist. Another aspect of this disclosure is a method of marking a packaged surface acoustic wave device, the method including grinding a back side of a piezoelectric substrate, the back side being opposite a front side of the piezoelectric substrate on which an interdigital transducer electrode of the surface acoustic wave device is disposed, and laser marking the piezoelectric substrate.

The laser marking can form a marking that extends less than 1 micron into the piezoelectric substrate. The laser marking includes can include a wavelength of laser light that allows the piezoelectric substrate to maintain structural integrity.

The laser marking can include using a deep ultraviolet laser. The laser marking can include using a laser with a wavelength of about 266 nanometers.

Grinding the back side of the piezoelectric substrate can include grinding the back side of the piezoelectric substrate until a thickness of the piezoelectric substrate is about 130 micrometers.

The piezoelectric substrate can include lithium niobate or lithium tantalite.

The method can additionally include forming a structure supported by the front side of the piezoelectric substrate and defining a cavity enclosing the interdigital transducer electrode. The structure supported by the front side of the piezoelectric substrate can be formed before grinding the back side of the piezoelectric substrate. Forming the structure supported by the front side of the piezoelectric substrate can include forming a photosensitive resin buffer coat.

Another aspect of this disclosure is a method of marking a packaged surface acoustic wave device, the method including forming a packaging structure on a first surface of a piezoelectric substrate on which an interdigital transducer electrode of the surface acoustic wave device is disposed, the packaging structure encapsulating the interdigital transducer electrode in a cavity, and directly marking a second surface of the piezoelectric substrate to form a marked portion of the piezoelectric substrate.

Directly marking the second surface of the piezoelectric substrate can include exposing the marked portion of the second surface of the piezoelectric substrate to laser light. The laser light can include deep ultraviolet light. The laser light can have a wavelength of about 266 nanometers.

Forming a packaging structure can include forming a layer of photosensitive resin and patterning the layer of photosensitive resin. The photosensitive resin can include a phenol resin. Forming a packaging structure can include forming a conductive terminal extending through the layer of photosensitive resin.

The marking can extend less than 1 micron into the piezoelectric substrate. The packaged surface acoustic wave device can have a thickness of less than 220 micrometers.

Another aspect of this disclosure is a packaged surface acoustic wave device that includes a cavity roof over interdigital transducers of a surface acoustic wave device, a plate over the cavity roof, and a photosensitive buffer coat layer over the plate, the packaged surface acoustic wave device having a height of 220 micrometers or less.

The packaged surface acoustic wave device can have a height of 200 micrometers or less. The photosensitive buffer coat layer can have a height of 15 micrometers or less.

The packaged surface acoustic wave device can additionally include a piezoelectric substrate having a first side on which the interdigital transducers are disposed, an edge portion of the first side of the piezoelectric substrate can be free from the photosensitive buffer coat layer.

The packaged surface acoustic wave device can additionally include a piezoelectric substrate having a first side and a second side opposite the first side, the interdigital transducers can be on the first side, and marking can extend into the second side. The marking can extend 1 micrometer or less into the piezoelectric substrate.

The packaged surface acoustic wave device can additionally include a terminal in physical contact with the plate though an opening in the photosensitive buffer coat layer.

The photosensitive buffer coat layer can include phenol resin. The photosensitive buffer coat layer can have a negative photosensitivity.

The packaged surface acoustic wave device can include a surface acoustic wave device configured to filter a radio frequency signal.

Another aspect of this disclosure is a packaged surface acoustic wave device that includes a piezoelectric substrate having a first side and a second side opposite the first side, the second side having markings extending therein, a cavity roof over interdigital transducers of the surface acoustic wave device on the first side of the piezoelectric substrate, a plate over the cavity roof, and an insulating layer over the plate.

Another aspect of this disclosure is a packaged surface acoustic wave device that includes a piezoelectric substrate, a cavity roof over interdigital transducers of the surface acoustic wave device, the interdigital transducers being disposed on the piezoelectric substrate, a plate over the cavity roof, and an insulating layer over the plate, an edge portion of the piezoelectric substrate being free from the insulating layer.

Another aspect of this disclosure is a packaged surface acoustic wave device that includes a cavity roof over interdigital transducers of a surface acoustic wave device, a plate over the cavity roof, and an insulating layer over the plate, the insulating layer having a thickness of 10 micrometers or less, and the packaged surface acoustic wave device having a height of 200 micrometers or less.

Another aspect of this disclosure is a method of manufacturing a packaged surface acoustic wave device, the method including forming a photosensitive resin over a plate, the plate being positioned over a cavity roof enclosing interdigital transducers of the surface acoustic wave device, and forming a terminal of the surface acoustic wave device over the photosensitive resin such that the terminal is in contact with the plate.

The method can additionally include exposing portions of the photosensitive resin to light and making other portions of the photosensitive resin to provide an opening though the photosensitive resin, where forming the terminal can include filling the opening with material of the terminal.

The method can additionally include exposing the photosensitive resin to light and making other portions of the photosensitive resin to provide an edge of a piezoelectric substrate free from the photosensitive resin, and the interdigital transducer electrodes can be positioned on the piezoelectric substrate.

The photosensitive resin can have a thickness of 15 micrometers or less. The photosensitive resin can include phenol resin.

The method can additionally include laser marking a piezoelectric substrate on which the interdigital transducers are disposed.

Another aspect of this disclosure is a method of marking a packaged surface acoustic wave device, the method including grinding a back side of a piezoelectric substrate, the back side being opposite a front side of the piezoelectric substrate on which interdigital transducers of the surface acoustic wave device are disposed, and laser marking the piezoelectric substrate.

The marking can extend less than 1 micron into the piezoelectric substrate.

The laser marking can include applying a wavelength of laser light that allows the piezoelectric substrate to maintain structural integrity. The laser marking can include using a deep ultraviolet laser.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/555,904, titled "PACKAGED SURFACE ACOUSTIC WAVE DEVICES," filed on even date herewith, the entire disclosure of which is hereby incorporated by reference herein. The present disclosure relates to U.S. patent application Ser. No. 16/555,860, titled "LASER-MARKED PACKAGED SURFACE ACOUSTIC WAVE DEVICES," filed on even date herewith, the entire disclosure of which is hereby incorporated by reference herein. The present disclosure relates to U.S. patent application Ser. No. 16/555,901, titled "METHODS FOR LASER MARKING PACKAGED SURFACE ACOUSTIC WAVE DEVICES," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 3A-3J are cross-sections of a portion of a packaged surface acoustic wave device at various stages of a manufacturing process according to an embodiment.

FIGS. 4A-4F are cross-sections of a portion of a partially packaged surface acoustic wave device at various stages of a manufacturing process including multiple photoresist exposures according to another embodiment.

FIGS. 5A-5E are cross-sections of a portion of a partially packaged surface acoustic wave device at various stages of a manufacturing process including a plating process according to another embodiment.

FIGS. 6A-6C are cross-sections of a portion of a partially packaged surface acoustic wave device at various stages of a manufacturing process including a spin-coating process according to another embodiment.

DETAILED DESCRIPTION OF CERTAIN EMBODIMENTS

Figure 1:
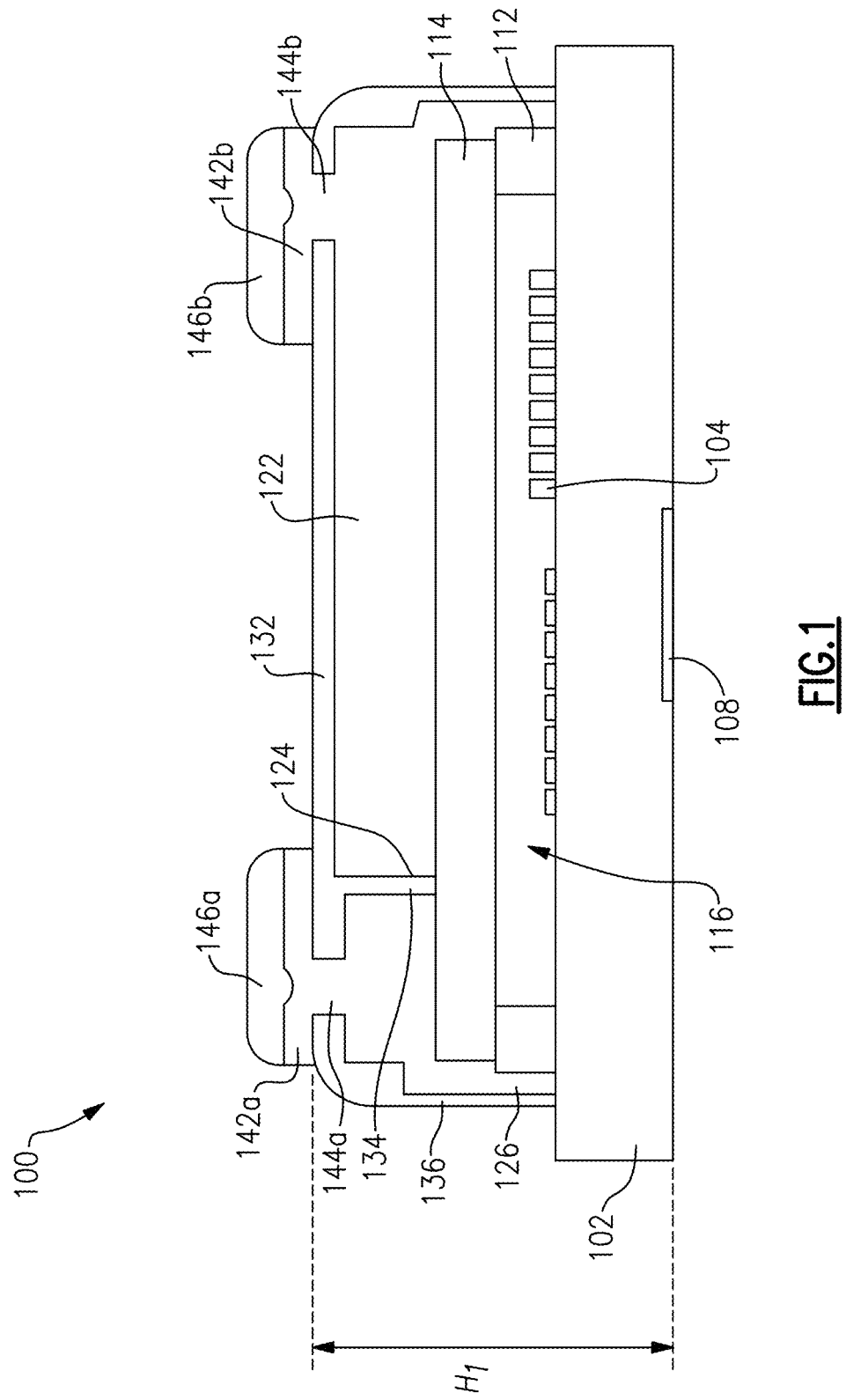
FIG. 1 is a cross sectional diagram of a packaged surface acoustic wave device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As the semiconductor market becomes increasingly competitive, there are more demands for smaller and thinner packaged surface acoustic wave devices. For instance, in certain applications, specifications call for surface acoustic wave device package heights of 200 microns or less so that the packaged surface acoustic wave devices can fit into a module. Methods of packaging are disclosed can achieve lower profile and lower cost for a package of a surface acoustic wave device. Surface acoustic wave devices with Wafer Level Chip Scale Packaging (WL-CSP) for surface acoustic wave filters with thinner packages are disclosed.

Methods of packaging surface acoustic wave devices are disclosed to reduce package height and/or lower packaging costs. Package structures disclosed herein include a photosensitive buffer coat layer, which acts as a protective layer covering a copper (Cu) plating. With a thin photosensitive buffer coat layer, the package structure can be formed without a post structure connecting a terminal to internal conductive structures of the package. Package structures disclosed herein include marking on a piezoelectric substrate of a surface acoustic wave device. A laser can mark the piezoelectric substrate without damaging the functionality of the piezoelectric substrate. Package structures disclosed herein can meet electrical performance and moldability strength specifications. The packaged surface acoustic wave devices disclosed herein can include surface acoustic wave filters arranged to filter radio frequency signals.

FIG. 1 is a cross sectional diagram of a packaged surface acoustic wave device according to an embodiment. Certain aspects of the packaged surface acoustic wave device 100 allow the thickness of the package to be reduced. For example, the packaged surface acoustic wave device 100 can have a package height $H_1$ of less than 220 micrometers (um). In certain embodiments, the package height $H_1$ can be less than 200 um. In one exemplary embodiment, the packaged surface acoustic wave device 100 has a package height $H_1$ of approximately 190 um.

As illustrated in FIG. 1, the packaged surface acoustic wave device 100 includes a die 102, and interdigital transducer electrodes 104 on the die 102. The die 102 is a piezoelectric substrate. The die 102 can include a lithium-containing piezoelectric material, such as a lithium niobate or lithium tantalate, for example. In some instances, the die 102 includes a multi-layer piezoelectric substrate. The die 102 can be approximately 130 um tall in certain instances. Other suitable thicknesses may also be used in other embodiments.

The die 102 can include a marked section 108 on a side of the die 102 opposite the interdigital transducer electrodes 104. The marked section 108 can be relatively shallow, compared to the overall thickness of the die 102. In some embodiments, the markings of the marked section 108 can extend less than 1 um into the die. By marking directly into the die 102, no additional marking film is included in the packaged surface acoustic wave device 100 of FIG. 1. This can reduce the overall height of the packaged surface acoustic wave device 100 relative to packaged surface acoustic wave devices that include marking films.

Interdigital transducer electrodes 104 of surface acoustic wave resonators are disposed on the die 102. The surface acoustic wave resonators can be arranged as a filter configured to filter a radio frequency signal. Any suitable number of surface acoustic wave resonators and/or surface acoustic wave filters can be included in the packaged surface acoustic wave device 100.

The interdigital transducer electrodes 104 are disposed within a cavity 116. The sides of the cavity 116 are formed by cavity walls 112 supported by the die 102. The roof of the cavity 116 is formed by a cavity roof 114 supported by the cavity walls 112 and extending over the interdigital transducer electrodes 104. The cavity 116 may be an air cavity. In some embodiments, the cavity 116 may be about 25 um tall, although other suitable cavity heights may also be used.

In some embodiments, one or both of the cavity roof 114 and the cavity walls 112 may include a photoresist material, as discussed in greater detail below.

Portions of the outer surfaces of the cavity roof 114 and the cavity walls 112 are covered by a conductive layer 122. In some embodiments, the conductive layer 122 may be formed by covering the outer surfaces of the cavity roof 114 and the cavity walls 112 with a seed layer, and then forming the conductive layer 122 over the seed layer using a plating process. The conductive layer 122 may include more than one section, which may be electrically isolated from one another by at least one gap 124 in the conductive layer 122. The conductive layer 122 may be about 25 um in thickness in certain embodiments, although other suitable thicknesses may also be used.

In some embodiments, the conductive layer 122 includes a layer of copper which is plated onto a seed layer including copper and/or titanium.

The conductive layer 122 may extend along the sides of the cavity walls 112, and down to the die 102, where the conductive layer 122 may contact interconnect structures such as electronic traces on the die 102, allowing electrical communication with the interdigital transducer electrodes 104 of surface acoustic wave resonator structures within the packaged surface acoustic wave device 100. The conductive layer 122 can be referred to as a plate layer in certain applications.

An insulation layer 132 extends over outer surfaces of the conductive layer 122, and fills the gap 124 in the conductive layer 122. Side portions 136 of the insulation layer 132 extend down the sides of the conductive layer 122 to the die 102. In certain embodiments, the insulation layer 132 is a photosensitive resin. In some embodiments, the conductive layer 122 may be a negative photoresist. In some embodiments, the photosensitive resin can be a phenol resin with rubber filler. Such a resin may have a viscosity of about 700 centipoise (cP), and may have a shelf life of about 9 months at 5° C., and a floor life of about 4 months. The cured resin may have a Young's modulus of elasticity of about 2.2 gigapascals (GPa), and a coefficient of thermal expansion of roughly 55/° C.

The insulation layer 132 can be made relatively thin. In some embodiments, the insulation layer may be about 15 um thick or less. In some embodiments, the thickness of an insulation layer 132 including phenol resin with rubber filler can be in a range from about 6 um to about 14 um. In some particular embodiments, the thickness of an insulation layer 132 including phenol resin with rubber filler may be about 10 um. The formation of the insulation layer 132 using a material such as the photosensitive resin can reduce the overall height of the packaged surface acoustic wave device 100 relative to other devices with thicker insulation layers.

In addition to the reduction in thickness, a photosensitive buffer coat layer as an insulation layer 132 can be removed to provide no significant residue on other portions of the die 102, such as the opening and saw street area where die are diced and singulated. The use of photosensitive buffer coat layer can also provide good coverage on the surfaces of a copper conductive layer, without significant copper oxidation after buffer coat curing. A photosensitive buffer coat layer can also pass ball shear and reliability tests.

The insulation layer 132 can be a photosensitive buffer coat layer. In some embodiments, negative-type photosensitive material can be used as the photosensitive buffer coat layer. The photosensitive buffer coat layer can be thicker at the saw street at the edge of the device, due to the trench made by the height of the cavity wall, cavity roof, and conductive layer. For positive-type photosensitive material, where the area of the photosensitive material to be removed is exposed to light, and exposure energy can be a significant factor in removing residue. A relatively high exposure dose can be applied in order to develop positive-type photosensitive material, to penetrate the relatively thick buffer coat at the edge of the device. This can make it difficult to develop positive material when exposure energy is not sufficiently high. With relatively high exposure energy, there can be thinning of the edges close to the saw street.

In contrast, for negative-type photosensitive material, the area of the photosensitive buffer intended to remain in the finished device is exposed to light. The development rate can depend on the properties of the photosensitive material. A negative-type photosensitive material can be easily developed at the saw street area at the side of the packaged surface acoustic wave device.

The packaged surface acoustic wave device 100 also includes terminals 142a and 142b located above respective portions of the conductive layer 122 and in physical contact with the conductive layer 122 through apertures in the insulation layer 132. Portions 144a and 144b of terminals 142a and 142b, respectively, extend through the apertures in the insulation layer 132. Solder layers 146a and 146b overlie the terminals 142a and 142b, respectively.

A conformal layer overlying the patterned insulation layer 132 can form both the connective portions 144a and 144b and the remainder of the terminals 142a and 142b. In such an embodiment, the terminal and the underlying conductive layer can be formed without a separate post between the two, connecting them. The terminal can include copper, or another suitable material. In some embodiments, the terminal may have a thickness of about 10 um. The solder layers 146a and 146b may include tin.

Figure 2A:
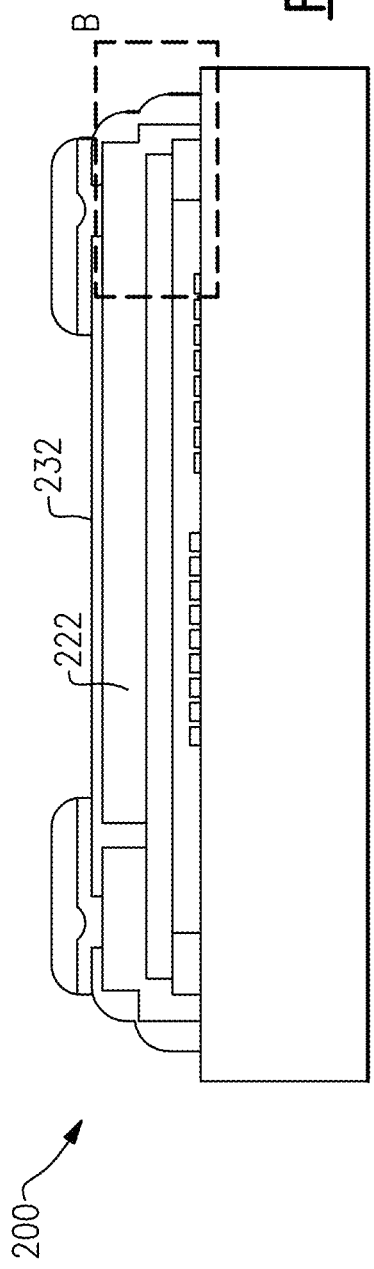
FIG. 2A is another cross section diagram of a packaged surface acoustic wave device according to another embodiment.
Figure 2B:
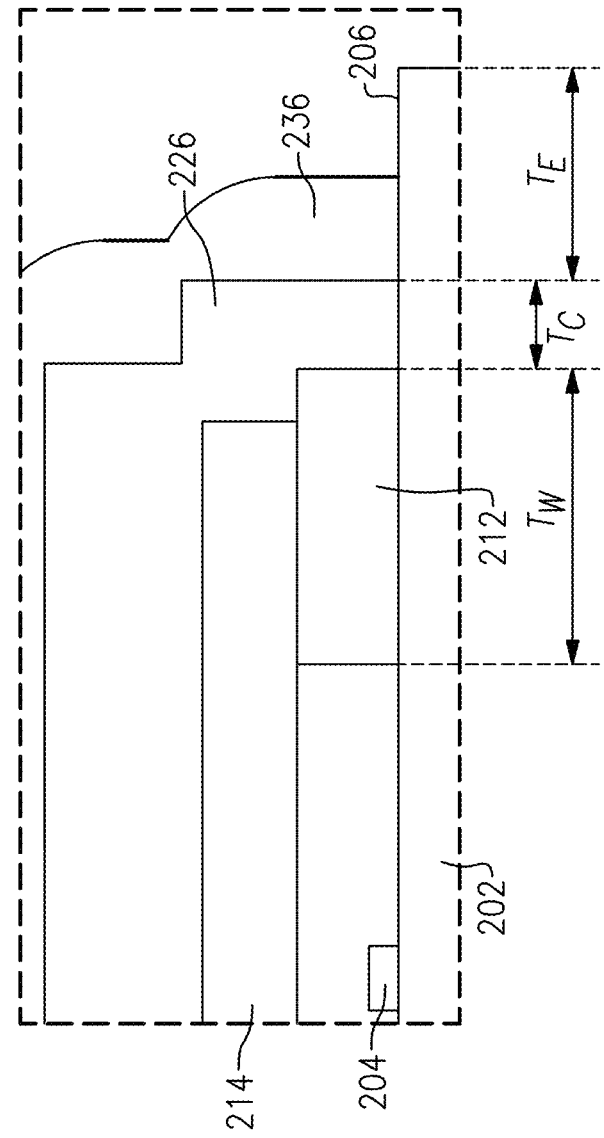
FIG. 2B is a detailed view of section B of FIG. 2A.

FIG. 2A is a diagram of a packaged surface acoustic wave device 200 according to an embodiment. FIG. 2B is a detail view of section B of FIG. 2A, illustrating the edge portion of the packaged surface acoustic wave device 200. As can be seen in FIG. 2B, the cavity walls 212 have a thickness $T_W$, the sidewall 226 of the conductive material 222 along the edge of the device has a thickness of $T_C$, and the distance from the outer edge of the sidewall 236 of the conductive material 232 to the edge of the die 202 has a thickness of $T_E$. In some embodiments, the thickness $T_W$ of the cavity walls 212 is about 30 um, the thickness $T_C$ of the portion of the sidewall 226 of the conductive material 222 in contact with die 202 is about 15 um, and the thickness $T_E$ from the outer edge of the sidewall 236 of the conductive material 232 to the edge of the die 202 is about 30 um.

FIG. 2B illustrates that an edge portion 206 of the wafer substrate is free from the photosensitive resin forming the insulation layer 232, such that the side 236 of the insulation layer 232 is set back from the outer edge of the die 202. The edge portion can extend a distance in a range from about 10 um to 20 um from an edge of the insulation layer 232 to an edge of the die 202. This allows the saw street area, where die are diced and singulated, to be free from the encapsulation of the insulating layer. This in turn allows the use of a relatively thinner blade to singulate die. This can facilitate smaller spacing between adjacent die and more die on a wafer of a given size. Moreover, a thinner blade for singulation can improve reliability by reducing chipping.

FIGS. 3A-3J are cross-sections of a portion of a packaged surface acoustic wave device at various stages of a manufacturing process according to an embodiment. In the stage shown in FIG. 3A, a die 302 is provided, including interdigital transducer electrodes 304 of one or more surface acoustic wave resonators. The die 302 may in some embodiments be a wafer with a plurality of discrete regions containing interdigital transducer electrodes which will be packaged into separate packaged surface acoustic wave devices and then separated in a singulation process. The die 302 may be a single piezoelectric layer, as shown. In other embodiments, the die 302 may be a multilayer piezoelectric substrate, including a support substrate in addition to a piezoelectric substrate. A multilayer piezoelectric substrate can include one or more additional layers along with the support substrate and the piezoelectric substrate. As one example, the support substrate can be a silicon substrate. In addition to the interdigital transducer electrodes 304, interconnect structures extending away from the interdigital transducer electrodes 304 may also be provided on the die 302.

In FIG. 3B, a cavity wall 312 has been formed, circumscribing the interdigital transducer electrodes 304. The cavity wall 312 may be a single wall with curved sections, or may include a plurality of wall segments meeting one another at angles to form a desired shape, such as a rectangle. The cavity wall 312 may include a photoresist or other photosensitive material. The height of the cavity wall 312 may correspond to a desired height of the resulting cavity. The cavity wall 312 may extend over interconnect structures supported by the die 302, so that a portion of the interconnect structure is located outside of the cavity wall 312. Cavity walls 312 may be formed at multiple locations across a wafer including piezoelectric material, each at a location of a package being formed.

In FIG. 3C, a cavity roof 314 has been formed, extending from one side of the cavity wall 312 to the other side. In the illustrated embodiment, the cavity roof 314 is a planar structure with an upper surface and a lower surface extending generally parallel to one another and to the underlying surface of the die 302. In some other embodiments, other shapes of cavity roofs may be formed, including shapes with a recess in the lower surface of the cavity roof facing the interdigital transducer electrodes 304. In the illustrated embodiment, the edges of the cavity roof 314 do not extend outward beyond the edges of the cavity wall 312. This shape may facilitate deposition of subsequent materials over the cavity-defining structure.

In FIG. 3D, a seed layer has been deposited over the outer surfaces of the cavity roof 314 and the cavity wall 320, and a conductive layer 322 has been formed at certain locations overlying the seed layer. The conductive layer 322 includes a gap 324 between two portions of the conductive layer 322. The conductive layer 322 also includes a sidewall portion 326 extending along the side of the cavity roof 314 and the cavity wall 312 and extending down to the die 302.

In FIG. 3E, exposed portions of the seed layer have been removed, and a buffer coat insulating layer 332 has been formed over the conductive layer 322. The insulating layer 332 has apertures 334 exposing underlying sections of the conductive layer 322. The insulation layer 332 also includes a sidewall portion 336 extending along the sides of the conductive layer 322 and down to the die 302. The insulating layer 332 may include a negative-type photosensitive material. The insulating layer 332 may include a photosensitive resin. The insulating layer 332 may include a phenol resin with rubber filler.

In FIG. 3F, terminals 340a and 340b have been formed overlying the apertures 334 in the insulation layer 332. The terminals 340a and 340b fill at least part of the apertures 334 and extend over the portions of the insulation layer 332 adjacent the apertures 334. In some embodiments, the terminals 340a and 340b may include copper or another suitable conductive material. The terminals 340a and 340b may include a layer of conformal material deposited over the apertures 334 and over the portions of the insulation layer 332 adjacent the apertures 334, such that the terminals 340a and 340b include respective connecting portions 344a and 344b within the apertures 334 and wider upper sections 342a and 342b above the connecting portions 344a and 344b.

In FIG. 3G, solder portions 346a and 346b have been formed over the upper surfaces of terminals 340a and 340b, respectively. The solder may include tin, in some embodiments, although other suitable solder material may be used as well. The solder portions 346a and 346b may facilitate bonding of the terminals 340a and 340b to external devices, making connections through the conductive material 322 with the surface acoustic wave resonators within the cavity 316.

In FIG. 3H, the side of the die 302 opposite the interdigital transducer electrodes 304 is back ground to remove a portion 309 of the die 302 in order to reduce the thickness of the die 302 to a desired final thickness. In some embodiments, the resulting trimmed die 302' may have an ultimate thickness of about 130 um, although other die thicknesses may also be used.

Figure 3I:
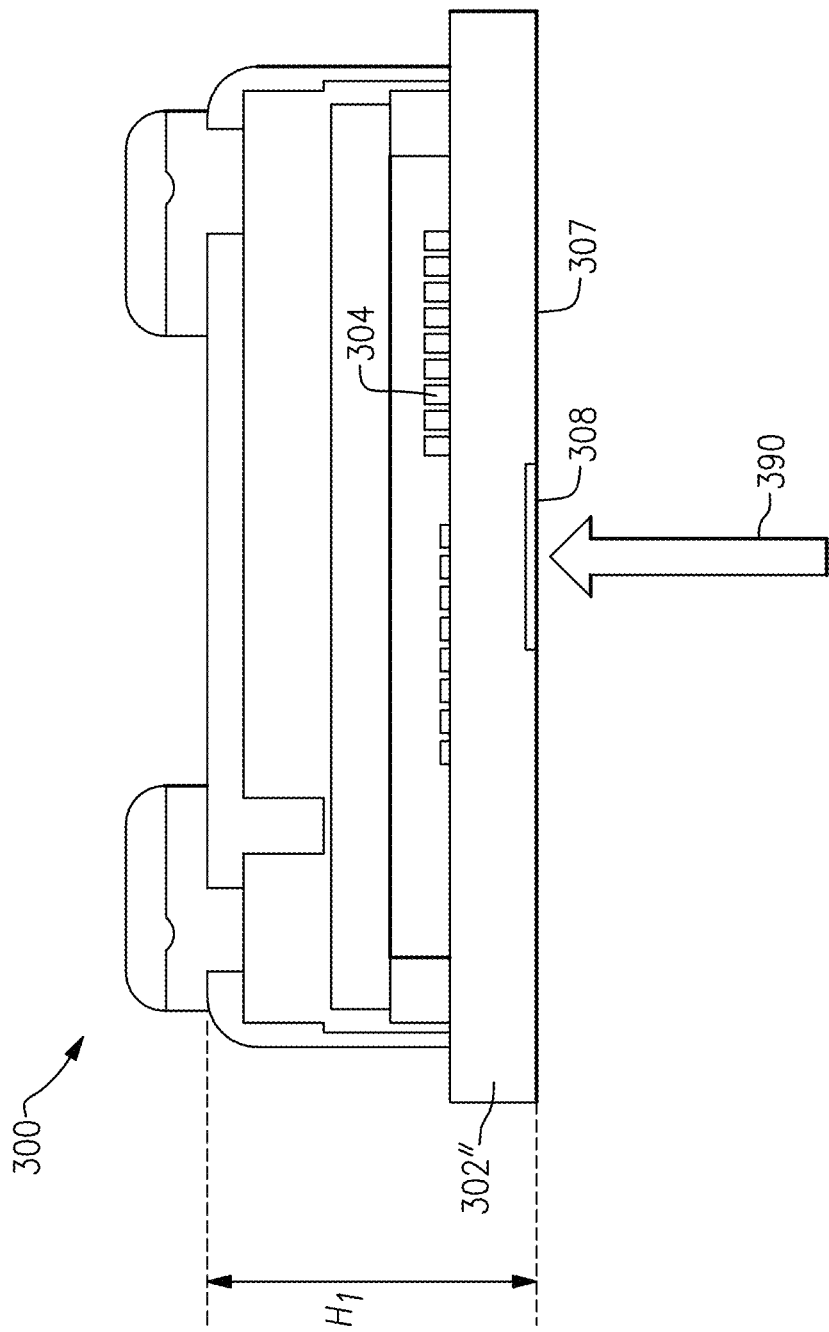

In FIG. 3I, the side 307 of the trimmed die 302' opposite the interdigital transducer electrodes 304 is exposed to illumination 390 from a marking laser to form marked and trimmed die 302" having a marked portion 308. Laser marking can be used for alignment of a module and/or for identifying a wafer and lot of a module. Laser marking can be performed directly on the piezoelectric material of trimmed die 302' as illustrated. By marking the trimmed die 302' directly, rather than forming an additional film or layer to be marked, the overall thickness of the resultant packaged surface acoustic wave device 300 can be reduced.

This direct marking can use illumination 390 from a deep ultraviolet laser. In one embodiment, such a laser can emit light having a wavelength that can mark a lithium-based substrate without damaging functionality of the lithium-based substrate for the surface acoustic wave device. As an example, the laser light can have a wavelength of 266 nanometers (nm). This wavelength of laser light, or a similar wavelength, can mark a lithium-based substrate, such as a lithium niobite substrate or a lithium tantalite substrate, to a relatively shallow depth, such as a depth of less than 1 micron. This shallow marking depth can prevent can a significant reduction of the strength of trimmed and marked die 302". In addition, this wavelength of laser light should not penetrate through the lithium niobate substrate. A multilayer piezoelectric substrate can be similarly marked using suitable laser wavelengths.

Figure 3J:
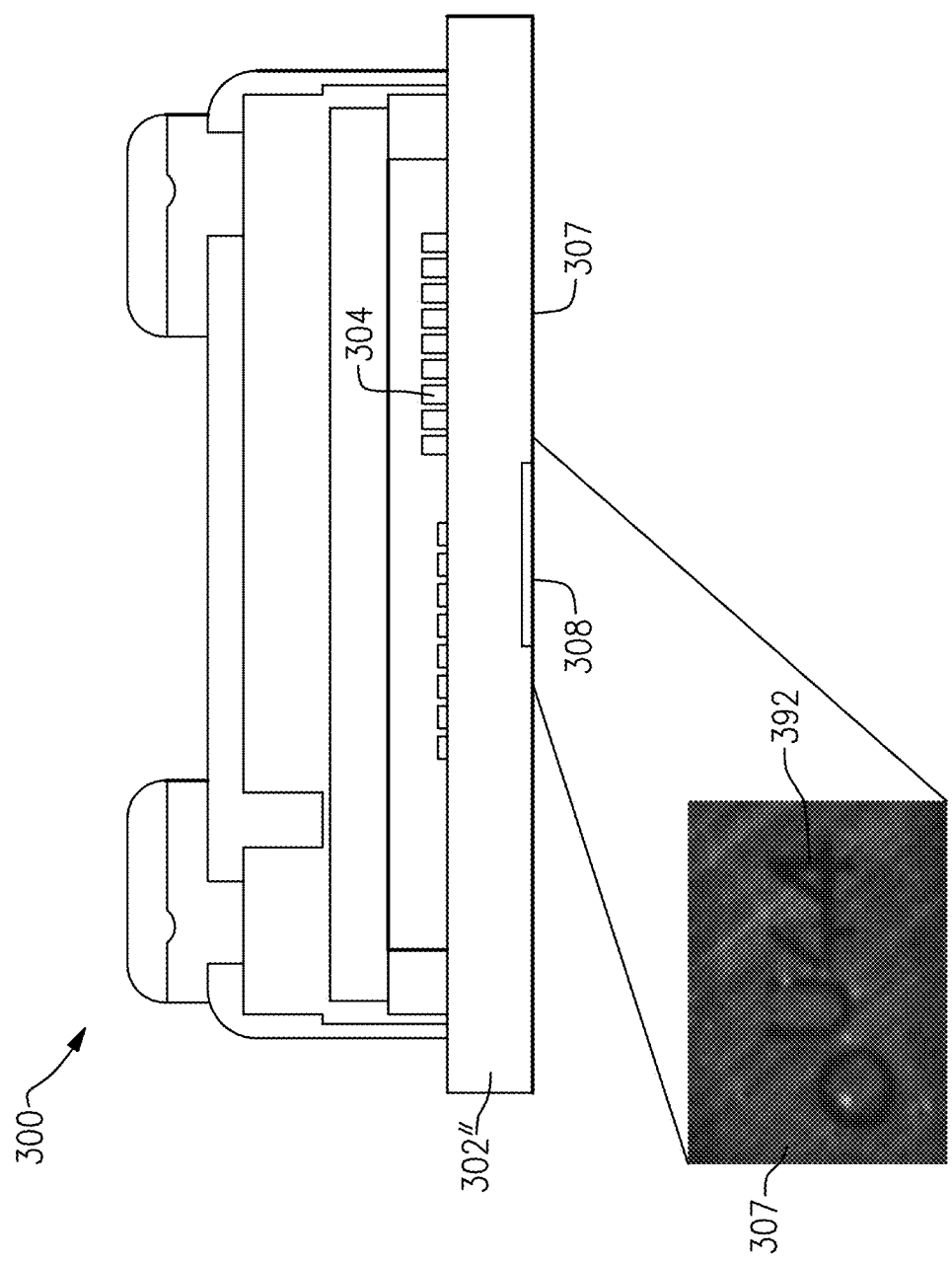

FIG. 3J shows the marked packaged surface acoustic wave device 300, including a detail view of the marked portion 308 of the side 307 of the trimmed die 302' opposite the interdigital transducer electrodes 304. The detail view illustrates the markings 392 in the marked portion 308 of the underside 307 of the die 302". Any suitable markings, including alphanumeric markings or other symbols, may be formed. The location of the marked portion 308 may be at any suitable location or locations on the die 302".

The resultant packaged surface acoustic wave device 300 can have an overall package height $H_1$ of less than 220 um, and in certain embodiments may be less than 200 um or approximately 190 um. Features which reduce the overall package height $H_1$ of device 300 include the use of a buffer coat layer to form insulation layer 332, and the direct marking of die 302" rather than the formation and marking of a separate layer. In addition, the process illustrated in FIGS. 3A-3J, a surface acoustic wave device can be packaged with fewer processing steps (e.g., about 25 fewer) than certain previous methods.

Although FIGS. 3B and 3C broadly illustrate the formation of cavity wall 312 and cavity roof 314, FIGS. 4A-4F illustrate in greater detail a specific embodiment of a manufacturing process for forming a cavity wall and a cavity roof. In particular, FIGS. 4A-4F show cross-sections of a portion of a partially packaged surface acoustic wave device at various stages of a manufacturing process including multiple photoresist exposures.

FIG. 4A shows the formation of a photosensitive layer 450 over a die 402 and interdigital transducer electrodes 404 supported by the die 402. The die 402 and interdigital transducer electrodes 404 may be similar to the die 302 and interdigital transducer electrodes 304 of FIG. 3A. The photosensitive layer 450 may include a photosensitive material, and may be formed having a thickness equal to the desired thickness of a cavity wall. Because the interdigital transducer electrodes 404 and other components supported by die 402 may provide an irregular upper surface on which the photosensitive layer 450 is formed, the photosensitive layer 450 may be formed by using a liquid type of photosensitive material, such as a liquid photoresin. The use of a liquid photosensitive material allows the formation of a photosensitive layer 450 of substantially constant thickness across the die 402 and over the interdigital transducer electrodes 404.

FIG. 4B shows the selective exposure of portions of the photosensitive layer 450 to illumination 490 using a mask 452. In the illustrated embodiment, the photosensitive layer 450 includes a positive-type photosensitive material, where the portions of the photosensitive layer 450 to remain in the device are shielded from light, and the portions 454 of the photosensitive layer 450 to be removed are exposed to light. The masked portions of photosensitive layer 450 can remain insoluble to a photoresist developer and the unmasked portions 454 of the photosensitive layer 450 that are exposed to light can become soluble to a photoresist developer.

FIG. 4C shows the masked portions of the photosensitive layer 450 of FIG. 4B remaining as cavity walls 412 after removal of the unmasked portions of the photosensitive layer. This removal may include, for example, exposure of the photosensitive layer 450 to a photoresist developer to remove the soluble portions of the photosensitive layer.

In FIG. 4D, a photoresist layer 460 has been formed over the cavity walls 412. In contrast to the photoresist material 450 which may include a liquid type photoresin to provide a constant thickness over an irregular surface, the photoresist layer 460 may be deposited as a film supported by the cavity walls, so that a generally planar structure may be formed overlying the interdigital transducer electrodes 404 and other components supported by die 402.

Figure 4E:
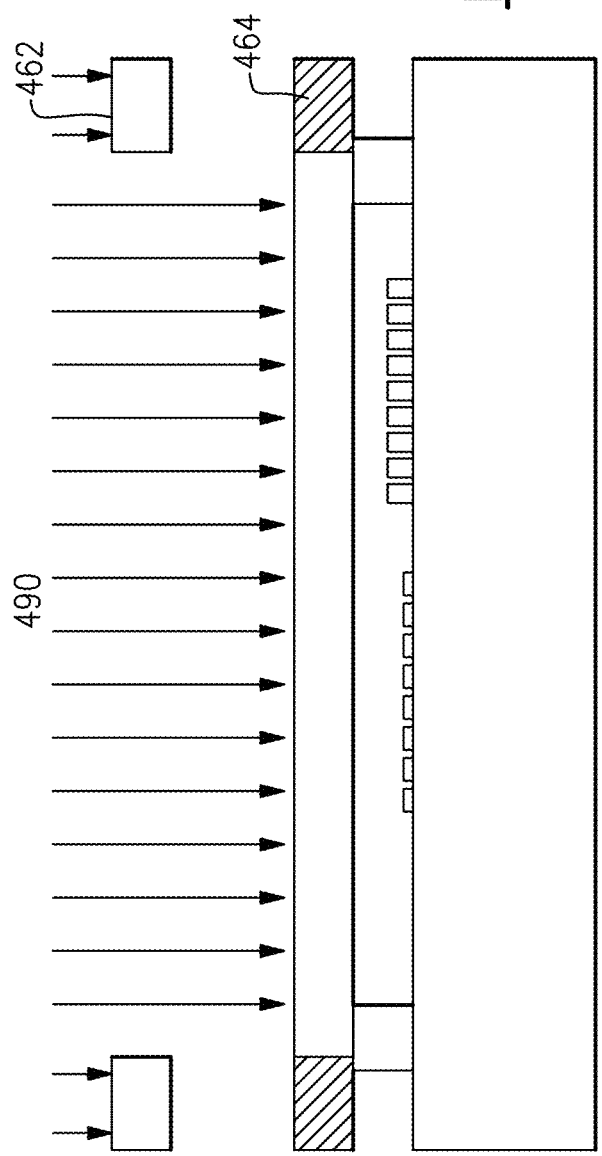

In FIG. 4E, the photosensitive layer 460 is selectively exposed to illumination 490 using a mask 462. In the illustrated embodiment, the photosensitive layer 460 includes a negative-type photosensitive material, where the portions of the photosensitive layer 460 to remain in the device are exposed light, and the portions 464 of the photosensitive layer 460 to be removed are shielded from light. The masked portions of photosensitive layer 450 can remain soluble to a photoresist developer and the unmasked portions 454 of the photosensitive layer 450 that are exposed to light can remain insoluble to a photoresist developer.

Figure 4F:
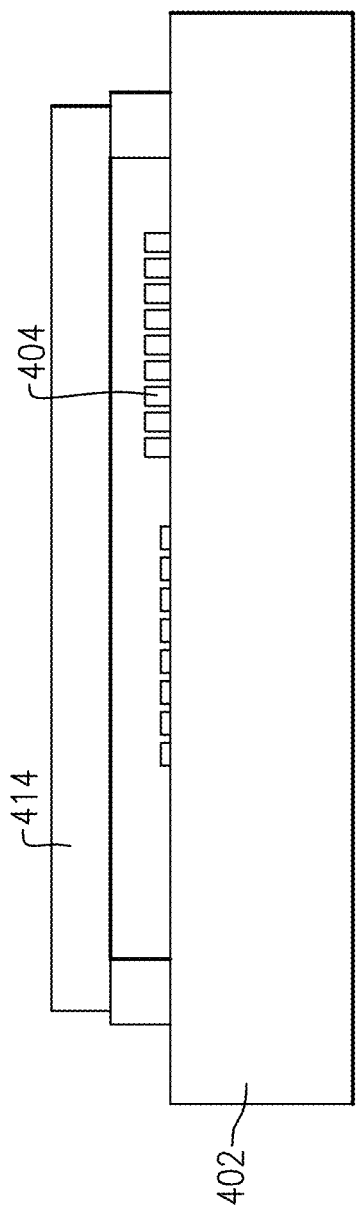

FIG. 4F shows the unmasked portion of the photosensitive layer 460 of FIG. 4E remaining as a cavity roof 414 after removal of the masked portions of the photosensitive layer. This removal may include, for example, exposure of the photosensitive layer 460 to a photoresist developer to remove the soluble portions of the photosensitive layer.

Although FIG. 3D broadly illustrates the formation of conductive layer 322, FIGS. 5A-5F illustrate in greater detail a specific embodiment of a manufacturing process for forming a conductive layer using a plating process. In particular, FIGS. 5A-5E are cross-sections of a portion of a partially packaged surface acoustic wave device at various stages of a manufacturing process including a plating process.

FIG. 5A shows that a seed layer 520 has been formed over the outside surfaces of a cavity wall 512 and a cavity roof 514. Like the partially packaged device of FIG. 4F, the cavity wall 512 and a cavity roof 514 are supported by a die 502 and define a cavity 516 enclosing interdigital transducer electrodes 504 supported by the die 502. The formation of the seed layer 520 may include performing surface modification on exposed surfaces of the cavity roof 514 or other surfaces, including cleaning these surfaces. Metal can then be sputtered over the cavity roof 514 and the exposed surfaces of the cavity wall 512 to form the seed layer 520. In some embodiments, titanium and copper can be sputtered to form a base metal for plating. The seed layer 520 may extend onto exposed portions of the die 502 adjacent the cavity walls 512.

In FIG. 5B, a photosensitive layer 570 has been formed over the seed layer 520. The photosensitive layer 570 may be generally conformal over the underlying structure as shown, but in other embodiments may be thinner over the cavity roof 514 than over the die on the side. The photosensitive layer 570 may have a thickness in the area overlying the cavity roof 514 at least as thick as the eventual conductive layer to be plated onto the seed layer, so that the photosensitive layer 570 can be used to define the shape of the conductive layer to be plated onto the seed layer 520.

Figure 5C:
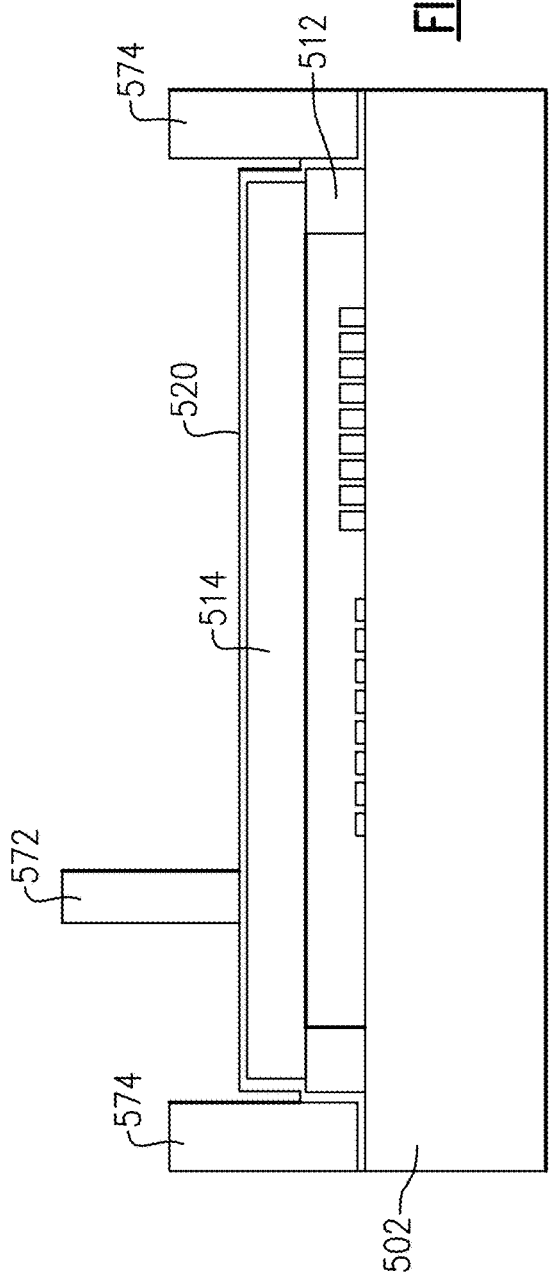

In FIG. 5C, the photosensitive layer 570 has been patterned, via selective exposure of the photosensitive layer 570 to illumination and subsequent removal of soluble portions of the photosensitive layer 570. This removal of portions of the photosensitive layer exposes portions of the underlying seed layer 520.

The remaining photosensitive layer portions include side portions 574 defining the edges of the conductive layer to be formed. These side portions 574 may overlie only portions of the seed layer 520 on the underlying die 502 away from the cavity walls 512. The remaining photosensitive layer portions also include a gap-defining portion 572 extending over a portion of the cavity roof 514. The gap-defining portion 572 may in some embodiments extend from one side portion 574 to another side portion 574, completely separating two exposed sections of the seed layer 520 from one another. In some embodiments, additional gap-defining portions may be included to separate the exposed portions of the seed layer 530 into multiple separate sections.

Figure 5D:
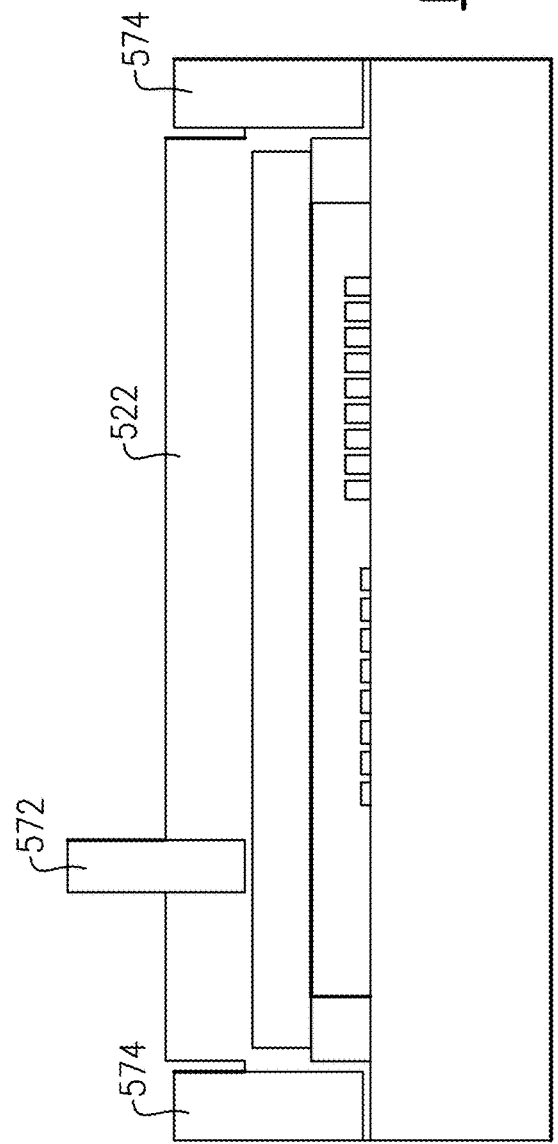

In FIG. 5D, a thicker conductive layer 522 has been plated onto the exposed portions of the seed layer 520. The shape of the thicker conductive layer 522 is defined by the remaining portions of the photosensitive layer, including the side portions 574 and the gap-defining portion 572. The conductive layer 522 may include copper or any other suitable material.

In FIG. 5E, the remaining portions of the photosensitive layer, including the side portions 574 and the gap-defining portion 572, have been removed. In addition, the exposed portions of the seed layer 520 underlying these portions of the photosensitive layer have been removed. The resulting conductive layer 522 may include discrete sections overlying the cavity roof 514, separated by a gap 524, as well as sidewall sections 526 extending along the sides of the cavity roof 514 and the cavity wall 512, down to the die 502.

Figure 6A:
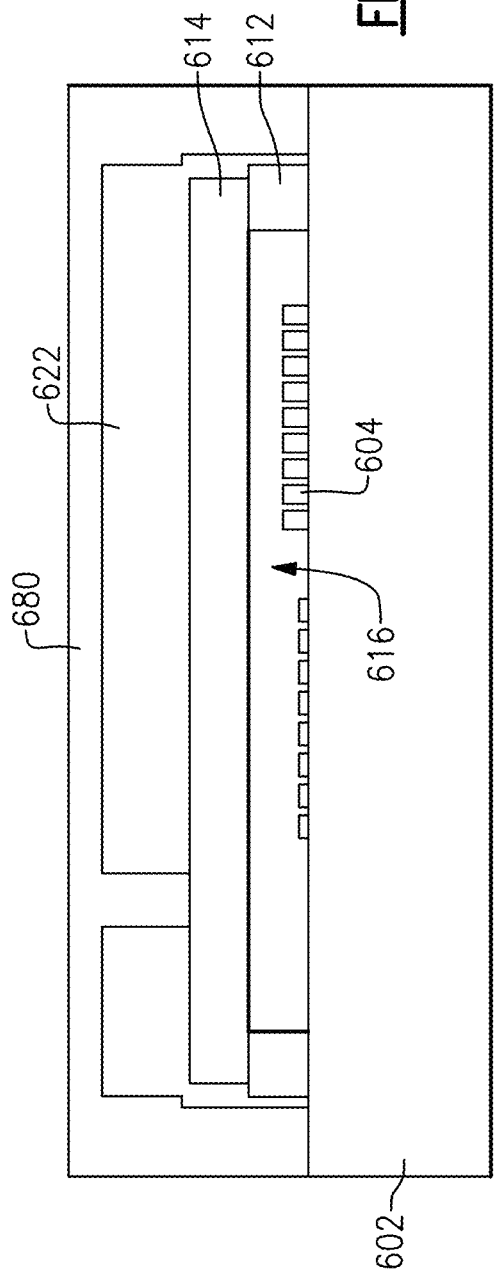

Although FIG. 3E broadly illustrates the formation of insulating layer 332, FIGS. 6A-6C illustrate in greater detail a specific embodiment of a manufacturing process for forming an insulating layer. In particular, FIGS. 6A-6C show cross-sections of a portion of a partially packaged surface acoustic wave device at various stages of a manufacturing process including a spin-coating process.

FIG. 6A shows that a buffer coat layer 680 has been formed over the outside surfaces of a conductive layer 622 formed over a cavity wall 612 and a cavity roof 614. Like the partially packaged device of FIG. 5E, the cavity wall 612 and a cavity roof 614 are supported by a die 602 and define a cavity 616 enclosing interdigital transducer electrodes 604 supported by the die 602. In some embodiments, the buffer coat layer may include a photosensitive resin such as phenol resin. The buffer coat layer may also include a rubber filler.

In the illustrated embodiment, the thickness of the buffer coat layer 680 overlying the conductive layer 622 is thinner than the thickness of the buffer coat layer 680 overlying the die 602 away from the conductive layer 622. The upper surface of the buffer coat layer 680 may be generally planar. In some embodiments, the buffer coat layer 680 may be deposited using a spin-coating process. The use of a spin-coating process may provide the generally planar upper surface despite the irregular profile of the underlying conductive layer 622 and die 602. The thickness of the buffer coat layer 680 in the area overlying the cavity roof 614 may in some embodiments be less than about 10 um, although other suitable thicknesses may also be used.

In FIG. 6B, the buffer coat layer 680 is selectively exposed to illumination 690 using a mask 682. In the illustrated embodiment, the buffer coat layer 680 includes a negative-type photosensitive material, where the portions of the buffer coat layer 680 to remain in the device are exposed to light, and the portions 684 of the buffer coat layer 680 to be removed are shielded from light. The masked portions 684 of buffer coat layer 680 can remain soluble to a photoresist developer and the unmasked portions of the buffer coat layer 680 that are exposed to light can become insoluble to a photoresist developer. Broad band light may be used to expose the buffer coat layer 680.

In FIG. 6C, the masked portions of the buffer coat layer 680 have been removed, and the remaining portions have been cured to form an insulation layer 632 extending over the conductive layer 622. The insulating layer 632 has apertures 634 exposing underlying sections of the conductive layer 622. The insulation layer 632 also includes a sidewall portion 636 extending along the sides of the conductive layer 622 and down to the die 602.

Figure 7:
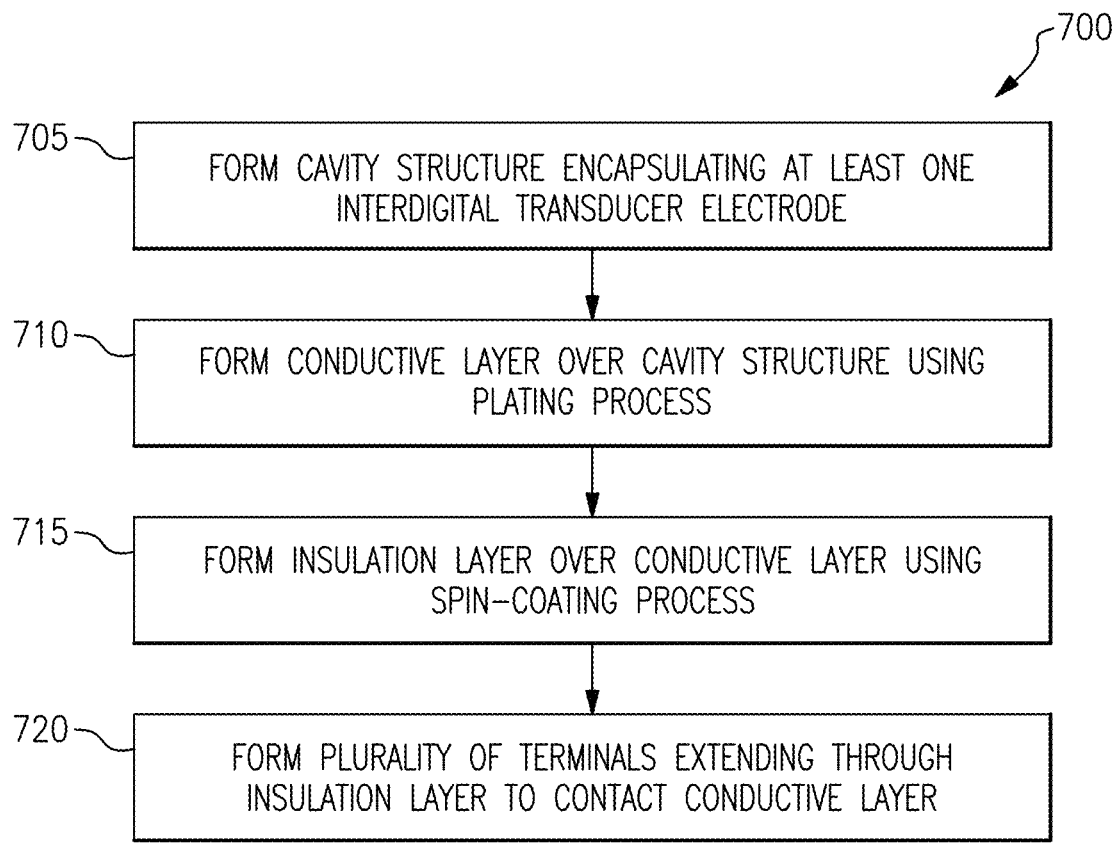
FIG. 7 is a flow diagram of a process of manufacturing a packaged surface acoustic wave device including a photosensitive buffer coat according to an embodiment.

FIG. 7 is a flow diagram of a process of manufacturing a packaged surface acoustic wave device including a photosensitive buffer coat according to an embodiment. The process 700 begins at a stage 705 where a cavity structure is formed on a die supporting at least one interdigital transducer electrode. The cavity structure encapsulates the at least one interdigital transducer electrode. The formation of the cavity structure can include the formation of a cavity wall or walls surrounding the at least one interdigital transducer electrode and the formation of a cavity roof supported by the cavity walls and extending over the at least one interdigital transducer electrode.

The process 700 moves to a stage 710 where a conductive layer is formed over the cavity structure including the cavity roof and cavity wall. The conductive layer may be formed by a plating process. The plating process may include the deposition, such as via sputtering, of a seed layer, followed by plating of the conductive layer onto the seed layer. The conductive layer may include sidewall portions in contact with the die. The conductive layer may include sections which are electrically separated from one another.

The process 700 moves to a stage 715 where an insulation layer is formed over the conductive layer using a spin-coating process. The insulation layer may include a buffer coat layer. The buffer coat layer may include a phenol resin, and may include rubber filler. The insulation layer may include a negative photoresist material. The insulation layer may include a plurality of apertures exposing different portions of the conductive layer. The insulation layer may include sidewall portions in contact with the die.

The process 700 moves to a stage 720, where a plurality of terminals are formed, each overlying and extending into an aperture in the insulation layer to contact the conductive layer. The terminals may include copper. The terminals may include a solder layer on top of the terminal.

Figure 8:
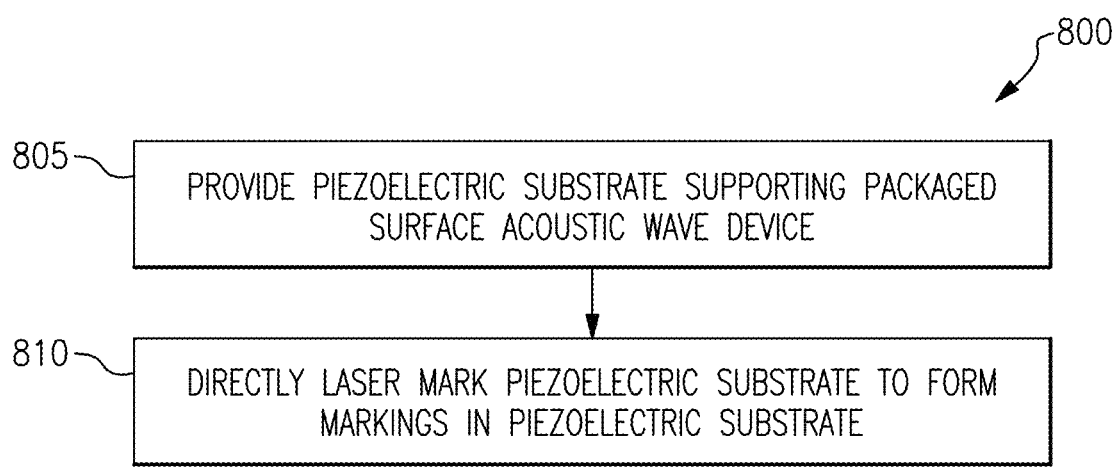
FIG. 8 is a flow diagram of a process of manufacturing a packaged surface acoustic wave device including laser marking of a piezoelectric layer according to an embodiment.

FIG. 8 is a flow diagram of a process of manufacturing a packaged surface acoustic wave device including laser marking of a piezoelectric layer according to an embodiment. The process 800 can be performed in combination with the process 700 in certain applications. The process 800 begins at a stage 805 where a piezoelectric substrate supporting a packaged surface acoustic wave device is provided. The packaged surface acoustic wave device may include at least one interdigital transducer electrode encapsulated within a cavity structure. The packaged surface acoustic wave device may include an insulation layer formed by a spin-on process. The insulation layer may include a negative photoresist, which may be a phenol resin, and may include rubber filler. The packaged surface acoustic wave device The process 800 moves to a stage 810 where the piezoelectric substrate is directly laser marked. The marking process does not increase the thickness of the packaged surface acoustic wave device, as no discrete marking layer is included. The laser marking may include using a deep UV laser to mark the piezoelectric substrate. The laser making can involve applying laser light having a wavelength of 266 nm in certain instances. Such a wavelength is suitable for marking lithium niobate and/or lithium tantalate substrates. The marked portion of the piezoelectric substrate may extend less than 1 um into the piezoelectric substrate.

The packaged surface acoustic wave devices disclosed herein can be implemented in a variety of applications, such as standalone surface acoustic wave filters, in radio frequency modules, or the like. Radio frequency modules that include packaged surface acoustic wave device in accordance with any suitable principles and advantages disclosed herein can also include one or more of a power amplifier, a radio frequency switch, a low noise amplifier, an inductor, or the like. Such radio frequency modules can benefit from reduced height and/or size of the packaged surface acoustic wave device.

Figure 9:
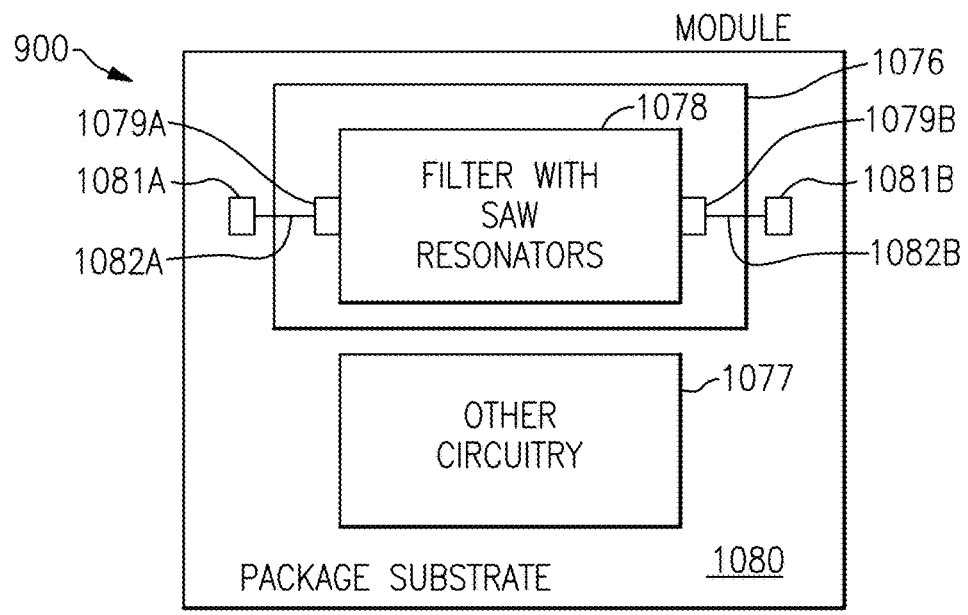
FIG. 9 is a schematic diagram of a radio frequency module that includes a filter with SAW resonators according to an embodiment.

FIG. 9 is a schematic diagram of a radio frequency module 900 that includes a surface acoustic wave component 1076 according to an embodiment. The illustrated radio frequency module 1200 includes the SAW component 1076 and other circuitry 1077. The SAW component 1076 can include one or more packaged SAW filters with any suitable combination of features of the SAW packages disclosed herein.

The SAW component 1076 shown in FIG. 9 includes a filter 1078 and terminals 1079A and 1079B. The filter 1078 includes SAW resonators, and may be packaged in accordance with any suitable principles and advantages disclosed herein. The terminals 1079A and 1079B can serve, for example, as an input contact and an output contact, and may extend through a buffer coat resin insulation layer. The SAW component 1076 and the other circuitry 1077 are on or supported by a common packaging substrate 1080 in FIG. 9. The package substrate 1080 can be a laminate substrate. The terminals 1079A and 1079B can be electrically connected to contacts 1081A and 1081B, respectively, on or supported by the packaging substrate 1080 by way of electrical connectors 1082A and 1082B, respectively. The electrical connectors 1082A and 1082B can be bumps or wire bonds, for example. The other circuitry 1077 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1200 can include one or more packaging structures to, for example, provide protection and/or facilitate easier handling of the radio frequency module 1200. Such a packaging structure can include an overmold structure formed over the packaging substrate 1200. The overmold structure can encapsulate some or all of the components of the radio frequency module 1000.

Figure 10:
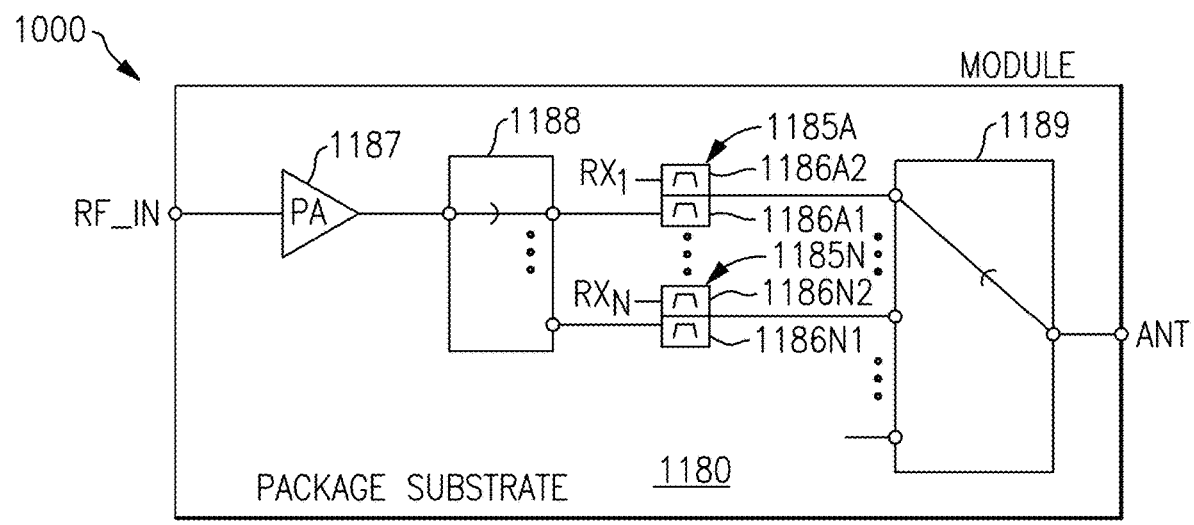
FIG. 10 is a schematic diagram of a radio frequency module that includes duplexers with surface acoustic wave resonators according to an embodiment.

FIG. 10 is a schematic diagram of a radio frequency module 1000 that includes a packaged surface acoustic wave component according to an embodiment. As illustrated, the radio frequency module 1300 includes duplexers 1185A to 1185N that include respective transmit filters 1186A1 to 1186N1 and respective receive filters 1186A2 to 1186N2, a power amplifier 1187, a select switch 1188, and an antenna switch 1189. The radio frequency module 1300 can include a package that encloses the illustrated elements. The illustrated elements can be disposed on a common packaging substrate 1180. The packaging substrate can be a laminate substrate, for example.

The duplexers 1185A to 1185N can each include two acoustic wave filters coupled to a common node. The two acoustic wave filters can be a transmit filter and a receive filter, and may be packaged with one another as discussed herein. As illustrated, the transmit filter and the receive filter can each be band pass filters arranged to filter a radio frequency signal. A packaged SAW device in accordance with any suitable principles and advantages disclosed herein can include one or more SAW resonators of one or more of the transmit filters 1186A1 to 1186N1 and/or one or more of the receive filters 1186A2 to 1186N2. Although FIG. 10 illustrates duplexers, any suitable principles and advantages disclosed herein can be implemented in other multiplexers (e.g., quadplexers, hexaplexers, octoplexers, etc.) and/or in switch-plexers.

The power amplifier 1187 can amplify a radio frequency signal. The illustrated switch 1188 is a multi-throw radio frequency switch. The switch 1188 can electrically couple an output of the power amplifier 1187 to a selected transmit filter of the transmit filters 1186A1 to 1186N1. In some instances, the switch 1188 can electrically connect the output of the power amplifier 1187 to more than one of the transmit filters 1186A1 to 1186N1. The antenna switch 1189 can selectively couple a signal from one or more of the duplexers 1185A to 1185N to an antenna port ANT. The duplexers 1185A to 1185N can be associated with different frequency bands and/or different modes of operation (e.g., different power modes, different signaling modes, etc.).

Figure 11:
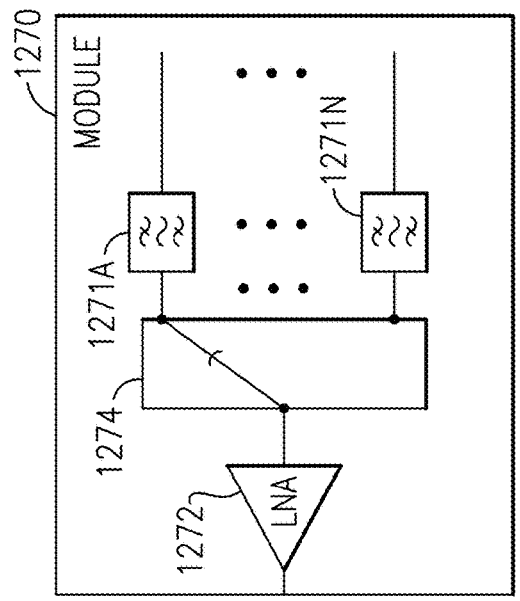
FIG. 11 is a schematic block diagram of a module that includes a power amplifier, a radio frequency switch, and duplexers that include one or more surface acoustic wave resonators according to an embodiment.

FIG. 11 is a schematic block diagram of a module 1210 that includes a power amplifier 1212, a radio frequency switch 1214, and duplexers 1291A to 1291N in accordance with one or more embodiments. The power amplifier 1212 can amplify a radio frequency signal. The radio frequency switch 1214 can be a multi-throw radio frequency switch. The radio frequency switch 1214 can electrically couple an output of the power amplifier 1212 to a selected transmit filter of the duplexers 1291A to 1291N. A packaged SAW device in accordance with any suitable principles and advantages disclosed herein can include one or more SAW resonators of one or more filters of the duplexers 1291A to 1291N and/or one or more of duplexers 1291A to 1291N.

Figure 12:
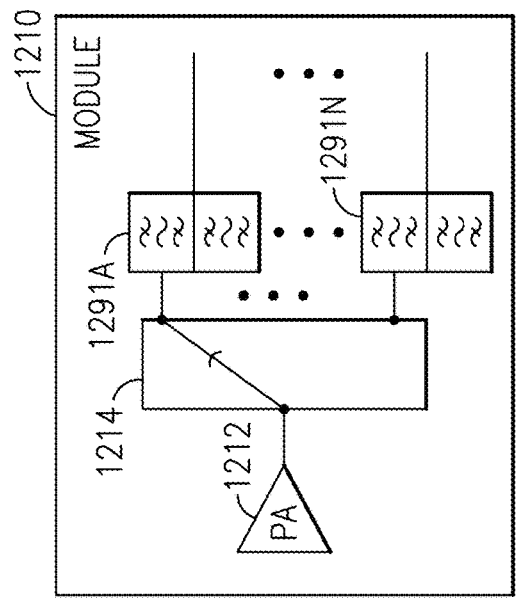
FIG. 12 is a schematic block diagram of a module that includes a low noise amplifier, a radio frequency switch, and surface acoustic wave filters according to an embodiment.

FIG. 12 is a schematic block diagram of a module 1270 that includes filters 1271A to 1271N, a radio frequency switch 1274, and a low noise amplifier 1272 according to an embodiment. A packaged SAW device in accordance with any suitable principles and advantages disclosed herein can include one or more SAW resonators of one or more filters of the filters 1271A to 1271N. Some or all of the filters may be packaged as discussed herein. Any suitable number of filters 1271A to 1271N can be implemented. The illustrated filters 1271A to 1271N are receive filters. In some embodiments (not illustrated), one or more of the filters 1271A to 1271N can be included in a multiplexer that also includes a transmit filter. The radio frequency switch 1274 can be a multi-throw radio frequency switch. The radio frequency switch 1274 can electrically couple an output of a selected filter of filters 1271A to 1271N to the low noise amplifier 1272. In some embodiments (not illustrated), a plurality of low noise amplifiers can be implemented. The module 1270 can include diversity receive features in certain applications.

Figure 13:
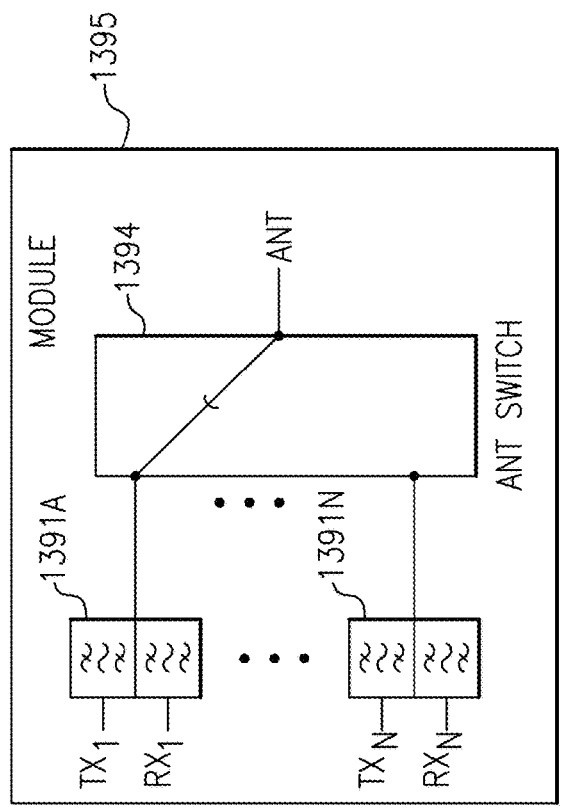
FIG. 13 is a schematic block diagram of a module that includes an antenna switch and duplexers that include one or more surface acoustic wave resonators according to an embodiment.

FIG. 13 is a schematic block diagram of a module 1395 that includes duplexers 1391A to 1391N and an antenna switch 1394. One or more filters of the duplexers 1391A to 1391N can be packaged as described herein and may include any suitable number of surface acoustic wave resonators, in accordance with any suitable principles and advantages discussed herein. Any suitable number of duplexers 1391A to 1391N can be implemented. The antenna switch 1394 can have a number of throws corresponding to the number of duplexers 1391A to 1391N. The antenna switch 1394 can electrically couple a selected duplexer to an antenna port of the module 1395.

Figure 14:
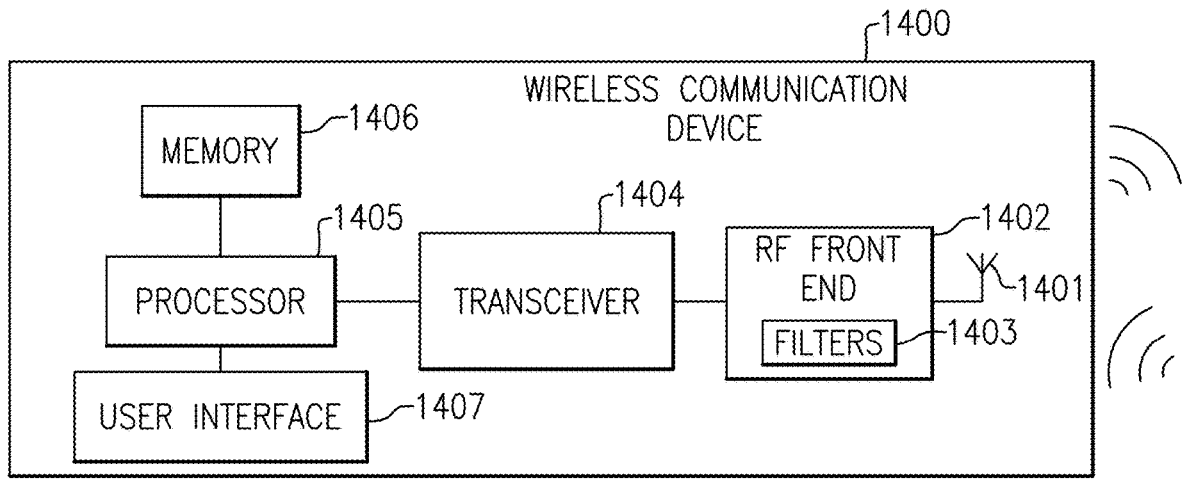
FIG. 14 is a schematic block diagram of a wireless communication device that includes a surface acoustic wave filter in accordance with one or more embodiments.

FIG. 14 is a schematic diagram of a wireless communication device 1400 that includes filters 1403 in a radio frequency front end 1402 according to an embodiment. The filters 1403 can include one or more SAW resonators in accordance with any suitable principles and advantages discussed herein. The wireless communication device 1400 can be any suitable wireless communication device. For instance, a wireless communication device 1400 can be a mobile phone, such as a smart phone. As illustrated, the wireless communication device 1400 includes an antenna 1401, an RF front end 1402, a transceiver 1404, a processor 1405, a memory 1406, and a user interface 1407. The antenna 1401 can transmit RF signals provided by the RF front end 1402. Such RF signals can include carrier aggregation signals. Although not illustrated, the wireless communication device 1400 can include a microphone and a speaker in certain applications.

The RF front end 1402 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1402 can transmit and receive RF signals associated with any suitable communication standards. The filters 1403 may be packaged with one another, or with a subset of the filters 1403, and can include packaged SAW devices including any suitable combination of features discussed with reference to any embodiments discussed herein.

The transceiver 1404 can provide RF signals to the RF front end 1402 for amplification and/or other processing. The transceiver 1404 can also process an RF signal provided by a low noise amplifier of the RF front end 1402. The transceiver 1404 is in communication with the processor 1405. The processor 1405 can be a baseband processor. The processor 1405 can provide any suitable base band processing functions for the wireless communication device 1400. The memory 1406 can be accessed by the processor 1405. The memory 1406 can store any suitable data for the wireless communication device 1400. The user interface 1407 can be any suitable user interface, such as a display with touch screen capabilities.

Figure 15:
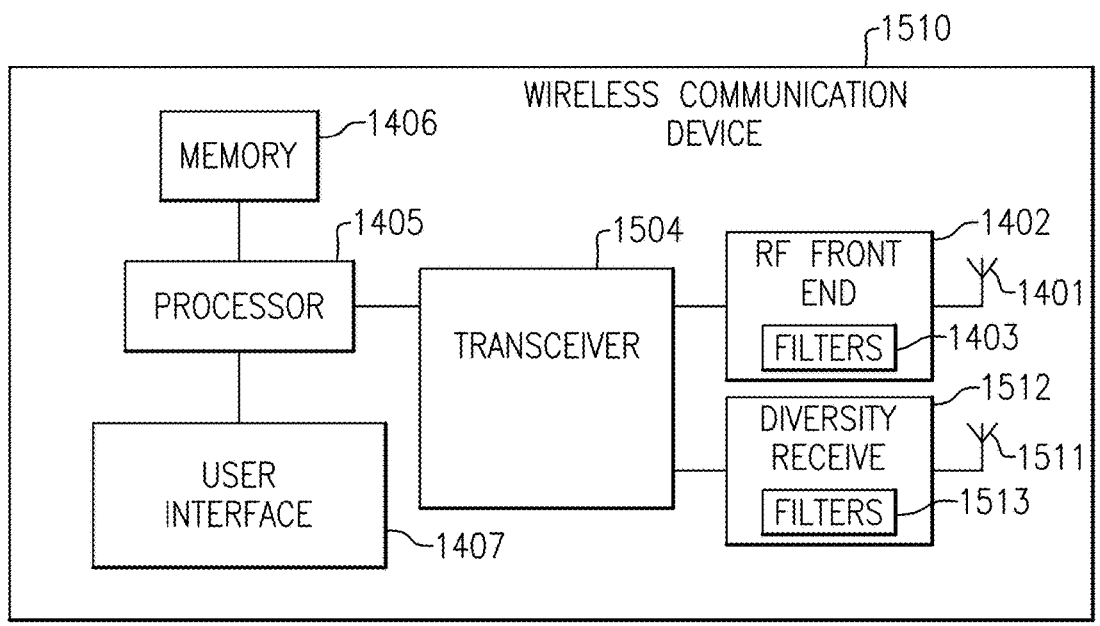
FIG. 15 is a schematic block diagram of another wireless communication device that includes a surface acoustic wave filter in accordance with one or more embodiments.

FIG. 15 is a schematic diagram of a wireless communication device 1510 that includes filters 1503 in a radio frequency front end 1502 and second filters 1513 in a diversity receive module 1512. The wireless communication device 1510 is like the wireless communication device 1500 of FIG. 14, except that the wireless communication device 1520 also includes diversity receive features. As illustrated in FIG. 15, the wireless communication device 1520 includes a diversity antenna 1511, a diversity module 1512 configured to process signals received by the diversity antenna 1511 and including filters 1513, and a transceiver 1504 in communication with both the radio frequency front end 1502 and the diversity receive module 1512. The filters 1513 may be packaged with one another, or with a subset of the filters 1513, and can include packaged SAW devices including any suitable combination of features discussed with reference to any embodiments discussed herein.

Any suitable principles and advantages of the surface acoustic wave devices disclosed herein can be implemented with one or more temperature compensated SAW resonators. Temperature compensated SAW resonators include a temperature compensation layer (e.g., a silicon dioxide layer) over an interdigital transducer electrode to bring a temperature coefficient of frequency closer to zero.

Packaged surface acoustic wave devices disclosed herein can include one or more surface acoustic wave resonators included in a filter arranged to filter a radio frequency signal in a fourth generation (4G) Long Term Evolution (LTE) operating band. Packaged surface acoustic wave devices disclosed herein can include one or more surface acoustic wave resonators included in a filter arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. Packaged surface acoustic wave devices disclosed herein can include one or more surface acoustic wave resonators included in a filter with a passband corresponding to both a 4G LTE operating band and a 5G NR operating band within FR1.

Any of the embodiments described above can be implemented in association with a radio frequency system and/or mobile devices such as cellular handsets. The principles and advantages of the embodiments can be used for any systems or apparatus that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave device comprising:
   a seed layer over at least a portion of a roof of an interdigital transducer electrode cavity structure;
   a conductive structure located over at least a portion of the seed layer;
   a photosensitive resin layer over at least a portion of the conductive structure, the photosensitive resin layer having at least one aperture formed therein, the photosensitive resin layer having a sidewall portion, at least a portion of the conductive structure disposed between a sidewall of the interdigital transducer electrode cavity structure and the sidewall portion of the photosensitive resin layer; and
   a conductive terminal in contact with the conductive structure, at least a portion of the conductive terminal extending through the at least one aperture in the photosensitive resin layer.

2. The packaged acoustic wave device of claim 1 further comprising laser marking a piezoelectric substrate on which an interdigital transducer electrode is disposed.

3. The packaged acoustic wave device of claim 1 wherein the conductive terminal includes a conductive layer extending over the at least one aperture extending through the photosensitive resin layer.

4. The packaged acoustic wave device of claim 1 further comprising a laser-marked piezoelectric substrate having a first side and a second side, the first side supporting at least a portion of the interdigital transducer electrode cavity structure, the second side of the laser-marked piezoelectric substrate having a laser-marked section.

5. A packaged acoustic wave device comprising:
   a seed layer over at least a portion of a roof of an interdigital transducer electrode cavity structure;
   a conductive structure located over at least a portion of the seed layer, the conductive structure including a gap extending through a portion thereof;
   a photosensitive resin layer over at least a portion of the conductive structure, the photosensitive resin layer having at least one aperture formed therein; and
   a conductive terminal in contact with the conductive structure, at least a portion of the conductive terminal extending through the at least one aperture in the photosensitive resin layer.

6. The packaged acoustic wave device of claim 5 wherein the gap exposes a portion of the interdigital transducer electrode cavity structure.

7. The packaged acoustic wave device of claim 6 wherein the photosensitive resin layer fills at least a portion of the gap.

8. A packaged acoustic wave device comprising:
   a seed layer over at least a portion of a roof of an interdigital transducer electrode cavity structure;
   a conductive structure located over at least a portion of the seed layer;
   a photosensitive resin layer over at least a portion of the conductive structure, the photosensitive resin layer having at least one aperture formed therein;
   a conductive terminal in contact with the conductive structure, at least a portion of the conductive terminal extending through the at least one aperture in the photosensitive resin layer; and
   a photoresist buffer coat.

9. The packaged acoustic wave device of claim 8 wherein the interdigital transducer electrode cavity structure covers at least a portion of an interdigital transducer electrode.

10. The packaged acoustic wave device of claim 8 wherein the photoresist buffer coat includes a sidewall portion in contact with a piezoelectric substrate and circumscribing the interdigital transducer electrode cavity structure.

11. A packaged acoustic wave device comprising:
    a conductive structure over at least a portion of a roof of an interdigital transducer electrode cavity structure;
    a photosensitive resin layer over at least a portion of the conductive structure, the photosensitive resin layer having at least one aperture formed therein, the photosensitive resin layer includes phenol resin, the photosensitive resin layer having a sidewall portion, at least a portion of the conductive structure disposed between a sidewall of the interdigital transducer electrode cavity structure and the sidewall portion of the photosensitive resin layer; and
    a conductive terminal in contact with the conductive structure, at least a portion of the conductive terminal extending through the at least one aperture in the photosensitive resin layer.

12. The packaged acoustic wave device of claim 11 wherein the conductive structure includes a gap extending through a portion thereof.

13. The packaged acoustic wave device of claim 12 wherein the gap exposes a portion of the roof of the interdigital transducer electrode cavity structure.

14. The packaged acoustic wave device of claim 13 wherein the photosensitive resin layer fills at least a portion of the gap.

15. The packaged acoustic wave device of claim 11 wherein the interdigital transducer electrode cavity structure covers at least a portion of an interdigital transducer.

16. The packaged acoustic wave device of claim 11 further comprising laser marking a piezoelectric substrate on which an interdigital transducer electrode is disposed.

17. The packaged acoustic wave device of claim 11 further comprising a photoresist buffer coat.

18. The packaged acoustic wave device of claim 17 wherein the photoresist buffer coat includes a sidewall portion in contact with a piezoelectric substrate and circumscribing the interdigital transducer electrode cavity structure.

19. The packaged acoustic wave device of claim 11 wherein the conductive terminal includes a conductive layer extending over the at least one aperture extending through the photosensitive resin layer.

20. The packaged acoustic wave device of claim 11 further comprising a laser-marked piezoelectric substrate having a first side and a second side, the first side supporting at least a portion of the interdigital transducer electrode cavity structure, the second side of the laser-marked piezoelectric substrate having a laser-marked section.

* * * * *